(12) United States Patent
Sakaki et al.

(10) Patent No.: US 11,186,042 B2
(45) Date of Patent: Nov. 30, 2021

(54) THREE-DIMENSIONAL SHAPE DATA GENERATING APPARATUS, THREE-DIMENSIONAL MODELING APPARATUS, AND NON-TRANSITORY COMPUTER READABLE MEDIUM

(71) Applicant: FUJIFILM BUSINESS INNOVATION CORP., Tokyo (JP)

(72) Inventors: Shigeyuki Sakaki, Kanagawa (JP); Satoshi Hasebe, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 179 days.

(21) Appl. No.: 16/556,775

(22) Filed: Aug. 30, 2019

(65) Prior Publication Data

US 2020/0290281 A1    Sep. 17, 2020

(30) Foreign Application Priority Data

Mar. 15, 2019   (JP) .............................. JP2019-048677

(51) Int. Cl.
   *B29C 64/386*       (2017.01)
   *G05B 19/4099*     (2006.01)
   (Continued)

(52) U.S. Cl.
   CPC ............ *B29C 64/386* (2017.08); *B33Y 50/00* (2014.12); *G05B 19/4099* (2013.01);
   (Continued)

(58) Field of Classification Search
   CPC . B29C 64/386; B29C 64/118; G05B 19/4099; G05B 2219/35134;
   (Continued)

(56) References Cited

U.S. PATENT DOCUMENTS

2018/0032060 A1*   2/2018  Zeng ................... G05B 19/4099
2018/0133972 A1*   5/2018  Morovic ............ G05B 19/4099
(Continued)

FOREIGN PATENT DOCUMENTS

JP        2016-206832 A     12/2016
JP        2017-222176 A     12/2017

*Primary Examiner* — Charles R Kasenge
(74) *Attorney, Agent, or Firm* — Oliff PLC

(57) ABSTRACT

A three-dimensional shape data generating apparatus includes: an acquiring section that acquires element data generated by dividing a three-dimensional shape into first elements, the three-dimensional shape being modeled with a plurality of modeling materials having different resolutions, each first element corresponding to a resolution of a first modeling material among the plurality of modeling materials; a dividing section that divides the three-dimensional shape into second elements, each second element corresponding to a second modeling material having a resolution lower than the resolution of the first modeling material and having a size larger than the first element; and a generating section that generates three-dimensional shape data through setting modeling materials for the first and second elements, respectively, according to the number of the first elements covered by the second element.

13 Claims, 19 Drawing Sheets

(51) Int. Cl.
  *B33Y 50/00*    (2015.01)
  *B29C 64/118*   (2017.01)
(52) U.S. Cl.
  CPC .. *B29C 64/118* (2017.08); *G05B 2219/35134* (2013.01); *G05B 2219/49007* (2013.01)
(58) Field of Classification Search
  CPC ........... G05B 2219/49007; G05B 2219/35145; B33Y 50/00; B22F 2999/00; B22F 10/30; B22F 10/20; Y02P 10/25; G06F 30/23; G06F 30/20
  See application file for complete search history.

(56) References Cited

U.S. PATENT DOCUMENTS

| | | | |
|---|---|---|---|
| 2018/0263783 A1 | 9/2018 | Dikovsky et al. | |
| 2019/0001576 A1* | 1/2019 | Eller | B29C 64/118 |
| 2020/0307174 A1* | 10/2020 | Woytowitz | B29C 64/118 |

* cited by examiner (CONT.)

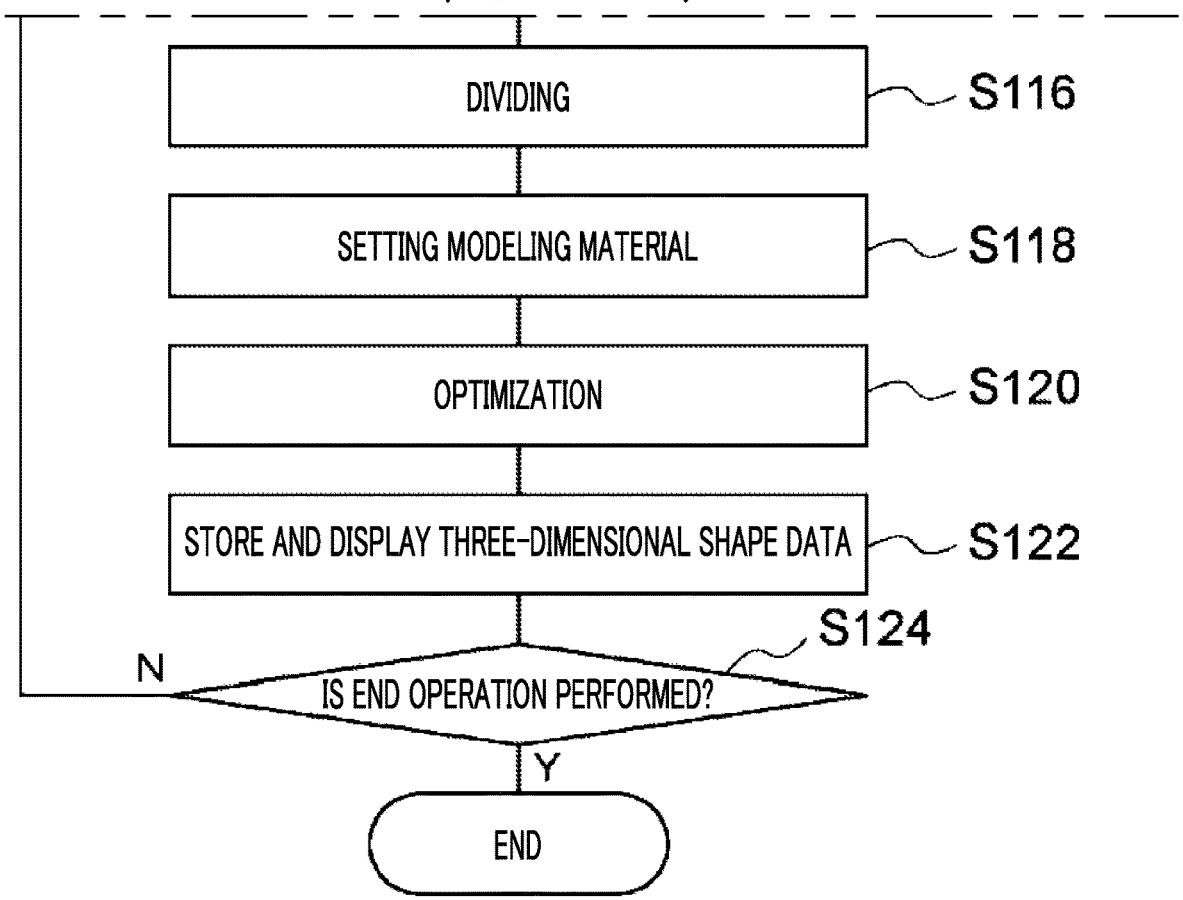

THREE-DIMENSIONAL SHAPE DATA GENERATING APPARATUS, THREE-DIMENSIONAL MODELING APPARATUS, AND NON-TRANSITORY COMPUTER READABLE MEDIUM

CROSS-REFERENCE TO RELATED APPLICATIONS

This application is based on and claims priority under 35 USC 119 from Japanese Patent Application No. 2019-048677 filed Mar. 15, 2019.

BACKGROUND

(i) Technical Field

The present disclosure relates to a three-dimensional shape data generating apparatus, a three-dimensional modeling apparatus, and a non-transitory computer readable medium for generating three-dimensional shape data.

(ii) Related Art

JP-A-2017-222176 discloses a physical reconstruction of a body part having a digital material formed by a combination of at least two modeling materials with different mechanical properties deposited by multi-material additive manufacturing, in which the combination of the modeling material is configured to mimic mechanical properties of the body part on a per voxel basis, and voxels are defined based on an image data of the body part.

JP-A-2016-206832 discloses a shape optimization analysis apparatus including: a reception unit that receives, as basic information about a connecting structure in which plural members are connected, a boundary condition including at least a fixed condition in a case of fixing the plural members and an external force condition in a case of applying an external force to the plural members, and a material properties of materials connecting the plural members; a temporary setting unit that temporarily sets, as a temporary area for constructing the connecting structure, a space that covers the plural members in a design area, and sets an initial value of virtual density indicating the degree required as the design area for each of unit element areas set in the design area; a virtual condition setting unit that sets, based on the basic information, a virtual condition at the boundary between the member and the design area, virtually divided into a connectable area allowing the members to connect with the design area and an unconnectable area not allowing the members to connect with the design area are virtually divided; and an arithmetic unit that calculates, based on the basic information and the virtual condition, virtual density of each unit element area from a result of finite element analysis for each unit element area set in the design area.

In a case where three-dimensional shape modeling is performed using plural different modeling materials, the resolution of a three-dimensional modeling apparatus may differ from one modeling material to another. In this case, at the boundary region between the modeling materials with different resolutions, a modeling material with a certain resolution needs to be selected from the modeling materials, and if a modeling material with a predetermined resolution is simply selected, the result may significantly vary from the desired physical property of the three-dimensional shape.

SUMMARY

Aspects of non-limiting embodiments of the present disclosure relate to providing a three-dimensional shape data generating apparatus, a three-dimensional modeling apparatus, and a non-transitory computer readable medium, which can reduce variation from the desired physical property of a three-dimensional shape as compared with a case where a modeling material with a predetermined resolution is simply selected at the boundary region between modeling materials with different resolutions.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a three-dimensional shape data generating apparatus including: an acquiring section that acquires element data generated by dividing a three-dimensional shape into first elements, the three-dimensional shape being modeled with plural modeling materials having different resolutions, each first element corresponding to a resolution of a first modeling material among the plural modeling materials; a dividing section that divides the three-dimensional shape into second elements, each second element corresponding to a second modeling material having a resolution lower than the resolution of the first modeling material and having a size larger than the first element; and a generating section that generates three-dimensional shape data through setting modeling materials for the first and second elements, respectively, according to the number of the first elements covered by the second element.

BRIEF DESCRIPTION OF THE DRAWINGS

Exemplary embodiments of the present invention will be described in detail based on the following figures, wherein.

DETAILED DESCRIPTION

Hereinafter, exemplary embodiments of the present disclosure will be described in detail with reference to drawings.

Figure 1:
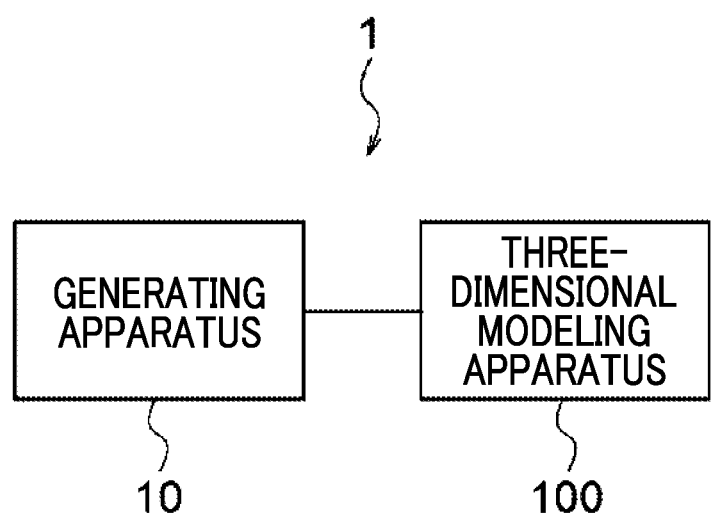
FIG. 1 is a block diagram of a three-dimensional modeling system.

FIG. 1 is a configuration diagram of a three-dimensional modeling system 1 according to the present exemplary embodiment. As illustrated in FIG. 1, the three-dimensional modeling system 1 includes a three-dimensional shape data generating apparatus 10 and a three-dimensional modeling apparatus 100.

Figure 2:
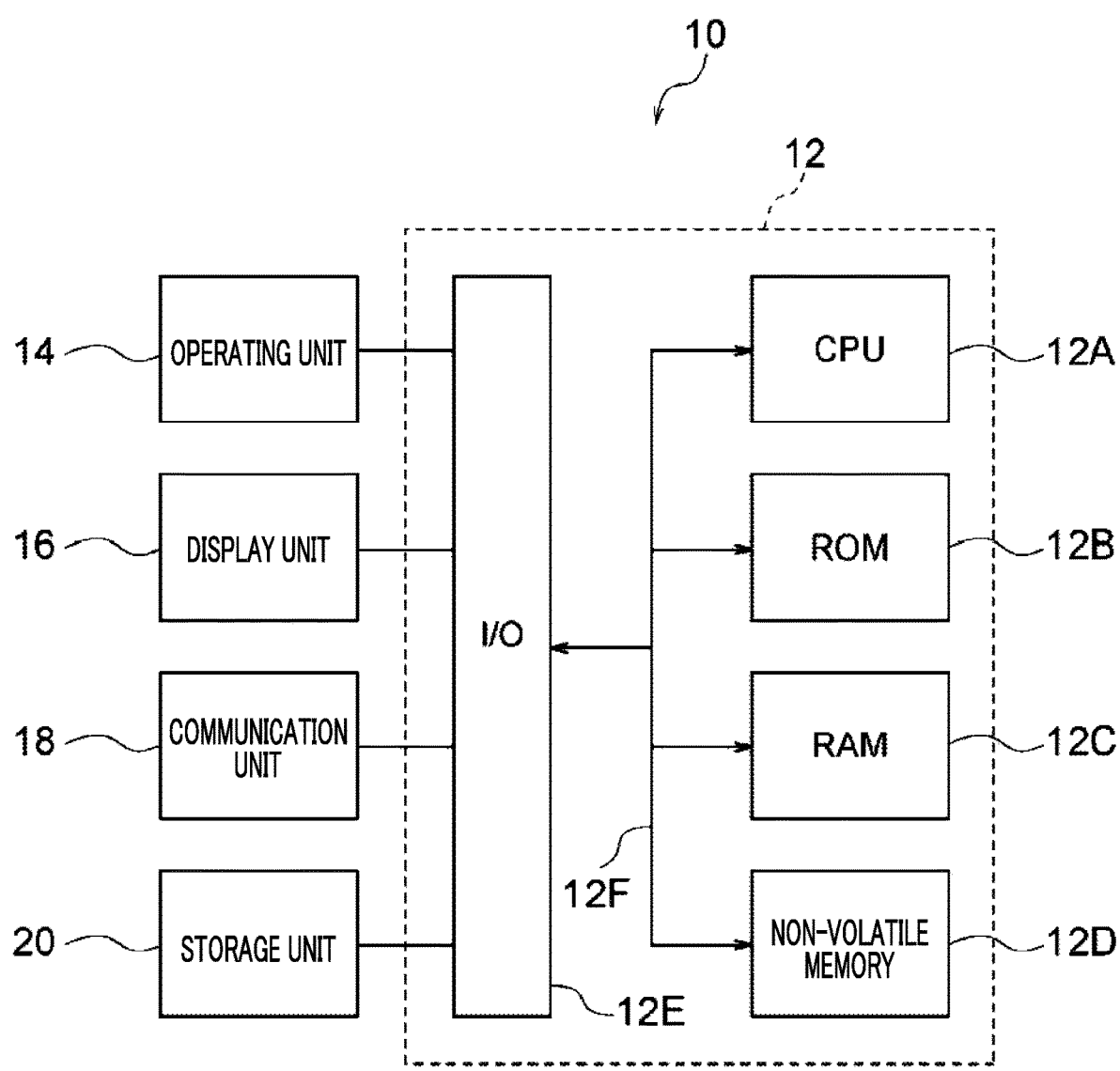
FIG. 2 is a block diagram illustrating an electrical configuration of a three-dimensional shape data generating apparatus.

Next, a configuration of the three-dimensional shape data generating apparatus 10 according to the present exemplary embodiment will be described with reference to FIG. 2.

The generating apparatus 10 may be, for example, a personal computer and the like, and includes a controller 12. The controller 12 includes a central processing unit (CPU) 12A, a read only memory (ROM) 12B, a random access memory (RAM) 12C, a non-volatile memory 12D, and an input/output interface (I/O) 12E. The CPU 12A, the ROM 12B, the RAM 12C, the non-volatile memory 12D, and the I/O 12E are connected with one another via a bus 12F.

In addition, an operating unit 14, a display unit 16, a communication unit 18, and a storage unit 20 are connected to the I/O 12E.

The operating unit 14 is configured to include, for example, a mouse and a keyboard.

The display unit 16 may be, for example, a liquid crystal display.

The communication unit 18 is an interface for performing data communication with external devices such as the three-dimensional modeling apparatus 100 and the like.

The storage unit 20 may be a non-volatile storage apparatus such as a hard disc and stores a three-dimensional shape data generating program, surface shape data, and table data, and the like, which will be described later. The CPU 12A reads and executes the three-dimensional shape data generating program stored in the storage unit 20.

Next, a functional configuration of the CPU 12A will be described.

Figure 3:
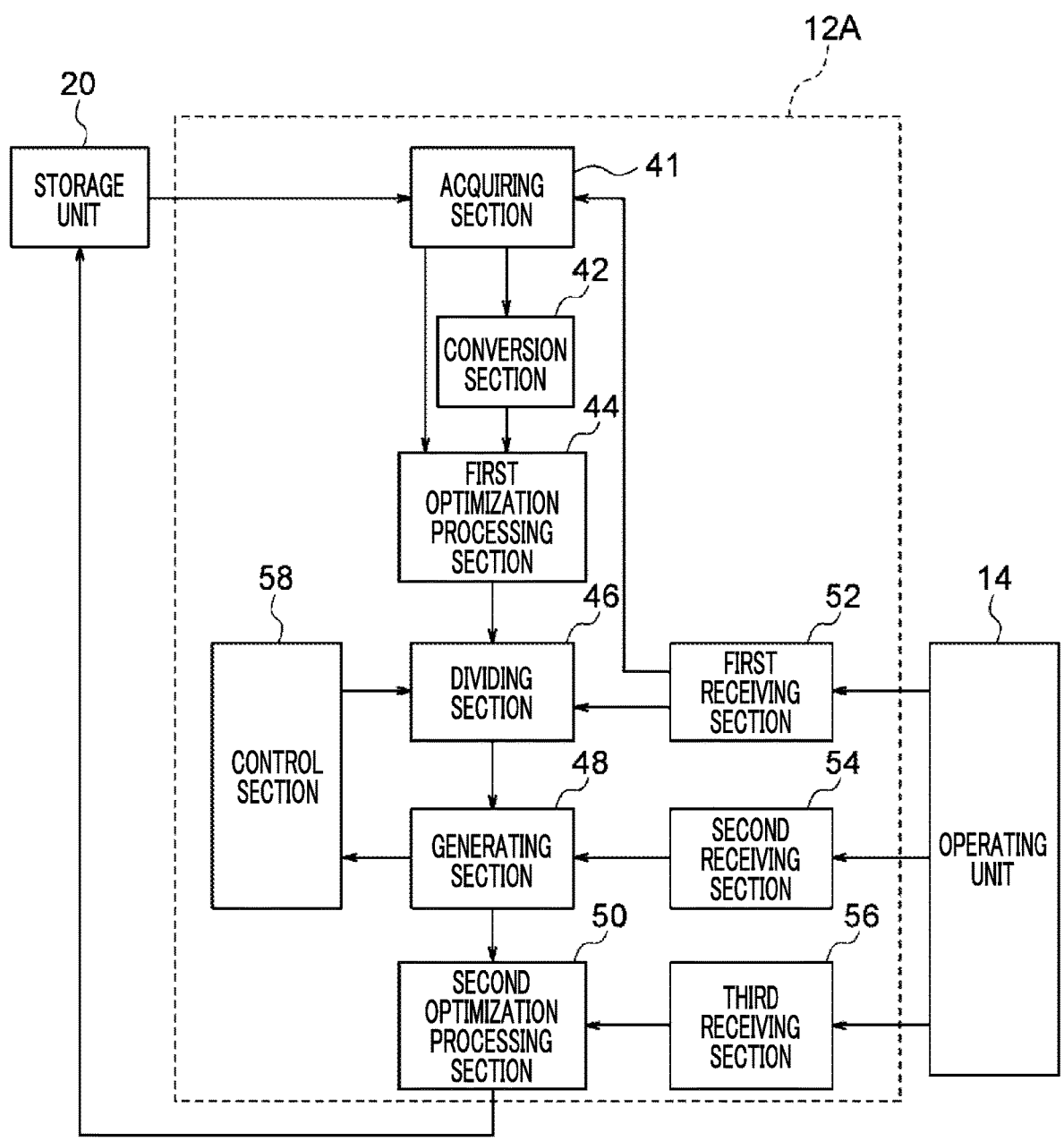
FIG. 3 is a block diagram illustrating a functional configuration of three-dimensional shape data generating apparatus.

As illustrated in FIG. 3, the CPU 12A functionally includes an acquiring section 41, a conversion section 42, a first optimization processing section 44, a dividing section 46, a generating section 48, a second optimization processing section 50, a first receiving section 52, a second receiving section 54, a third receiving section 56, and a control section 58.

The acquiring section 41 acquires element data generated by dividing a three-dimensional shape into first elements, where the three-dimensional shape is modeled with plural modeling materials having different resolutions, and the first element corresponds to the resolution of a first modeling material among the plural modeling materials. Here, the resolution is a minimum size in outputting or processing a modeling material handled by the three-dimensional modeling apparatus 100. Therefore, low resolution means that a value of resolution is large. Also, high resolution means that a value of resolution is small.

Figure 4:
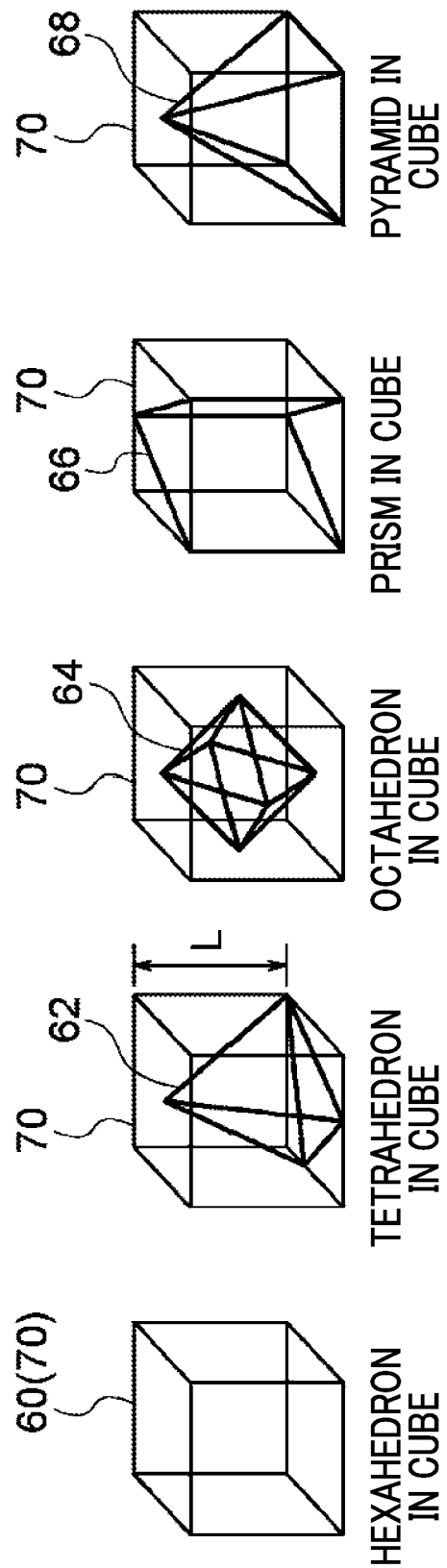
FIG. 4 is a diagram illustrating an example of an element shape.

An element is a basic unit that constitutes the three-dimensional shape. As illustrated in FIG. 4, the element shape includes a hexahedron 60, a tetrahedron 62, an octahedron 64, a prism 66, and a pyramid 68, but it is not limited thereto.

The resolution refers to the length of one side of a cube of the smallest size including an element. For example, as shown in FIG. 4, in a case where the element is the tetrahedron 62, the resolution is the length L of one side of a cube 70 of the minimum size including the tetrahedron 62.

The element data is data representing a set of plural first elements. Here, in the present exemplary embodiment, the first element is an element corresponding to the modeling material having the highest resolution (the value of the resolution is small) among plural modeling materials having different resolutions. That is, the first element is the element having the smallest size among the elements corresponding to the plural modeling materials.

In the present exemplary embodiment, a case where element data generated by dividing the three-dimensional shape into the first elements are stored in advance in the storage unit 20 is described. However, only the surface shape data representing the surface shape of the three-dimensional shape may be stored in the storage unit 20 to convert the surface shape data into the element data. In the surface shape data, the three-dimensional shaped surface is defined, but an internal structure is not defined. The surface shape data includes, for example, computer-aided design (CAD) data and stereolithography (STL) data and the like, but the surface shape data is not limited thereto.

A conversion method of converting the surface shape data into the element data, for example, includes a Delaunay dividing method, an advancing front method, and an Octree-based dividing method as a tetra mesh generating method. Also, a hexa-mesh generating method includes a blocking method, and a polyhedral mesh generating method includes a cut-cell method, a Voronoi division method, and the like.

The size of the element constituting the three-dimensional shape may be one type or two or more types. For example, a portion in which the shape of the three-dimensional shape changes may be converted into an element having a smaller size than a portion in which the shape does not change.

Figure 5:
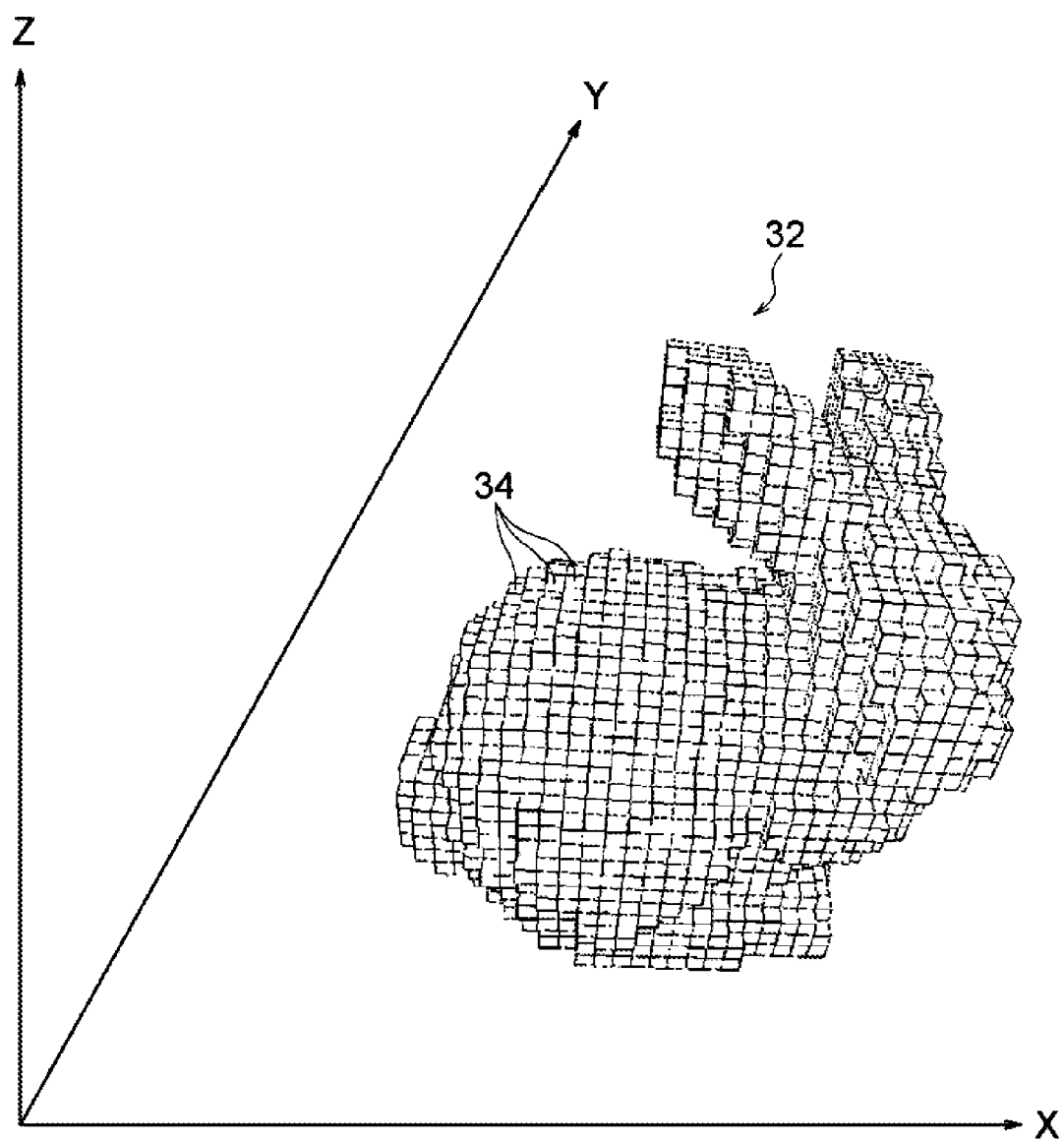
FIG. 5 is a diagram illustrating an example of a three-dimensional shape represented by a three-dimensional element of a rectangular parallelepiped.

FIG. 5 illustrates a three-dimensional shape 32 represented by plural three-dimensional elements as an example. As illustrated in FIG. 5, the three-dimensional shape 32 is composed of plural three-dimensional elements 34 of a rectangular parallelepiped.

Here, the three-dimensional element 34 is a basic element of the three-dimensional shape 32. In the present exemplary embodiment, a case where the three-dimensional element is a hexahedron, that is, a rectangular parallelepiped, is described.

In a case where the first element is a non-rectangular parallelepiped shape element, other than the rectangular parallelepiped, the conversion section 42 converts the non-rectangular parallelepiped shape element into the rectangular parallelepiped shape element corresponding to the resolution of the first modeling material. For example, in a case where the first element is a tetrahedron other than a hexahedron, the first element is converted into the hexahedron element. Also, in a case where the three-dimensional shape is divided into rectangular parallelepiped shape elements, the conversion section 42 may generate element data by setting the modeling material in each of the rectangular parallelepiped shape element according to the number of non-rectangular parallelepiped shape elements covered by the rectangular parallelepiped shape element.

The first optimization processing section 44 performs optimization processing that optimizes a three-dimensional shape structure for the element data acquired by the acquiring section 41. The optimization processing cannot be analytically dealt with because it is discrete, that is, there are only two values, presence or absence of the modeling material in a certain place. A method of converting the optimization processing into processing that can be analytically solved, includes a solid isotropic material with penalization method (SIMP), a homogenization method, and the like.

Hereinafter, the SIMP method will be described as an example.

Figure 6:
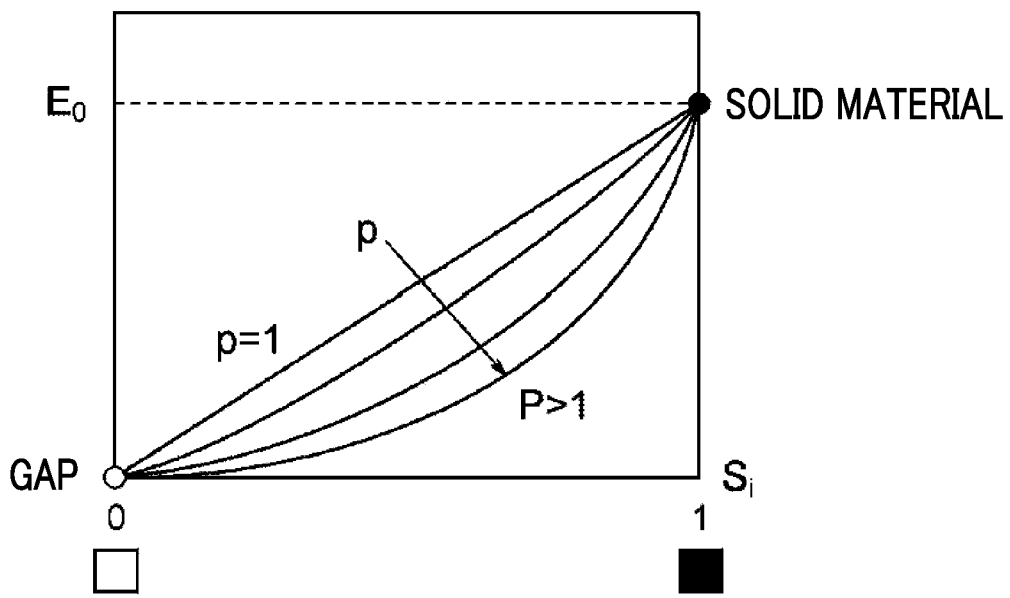
FIG. 6 is a diagram for describing an optimization method.

In the SIMP method, it is assumed that a modeling material at a certain place takes not only 1 (present) or 0 (not present) but also intermediate values, and that the regularized density Si is defined and Young's modulus at Si is proportional to the power of the regularized density Si as illustrated in FIG. 6.

In the following equation (1), in FIG. 6, $E_0$ is Young's modulus of a solid material, and p is a power multiplier. By introducing such a model, the three-dimensional shape structure is expressed as a function of continuous variables, as described later. By solving the function, it is suggested that the modeling material may disappear as the regularized density becomes close to 0, while the material may appear as the regularized density becomes close to 1.

$$E(s_i) = (s_i)^p E_0 \qquad (1)$$

The function shown below uses the SIMP method to optimize the rigidity of a three-dimensional shape.

$$\min_x : c(x) = U^T K U = \sum_{e=1}^{N} (x_e)^p u_e^T k_0 u_e \qquad (2)$$

$$\text{subject to: } g(x) = V(x) - V_0 \times f \leq 0$$
$$: KU = F$$
$$: 0 < x_{min} \leq x \leq 1$$

Here, c (x) is compliance, U is the displacement of a three-dimensional shape, K is a stiffness matrix, N is the number of elements constituting the three-dimensional shape, f is the volume fraction of a modeling material, $x_e$ is the regularized density of each element, $V_0$ is the volume of a range where optimization is performed (the volume in a case where all $x_e$ are 1), F is an external force, and $u_e$ is the displacement of the element e.

An objective function c(x) is a function that minimizes the compliance which is an index indicating how easily an object deforms, that is, the function maximizing the rigidity.

In addition, a constraint condition g(x) is a condition that a current density V (x) is less than the volume fraction f.

An optimal solution is obtained using an optimality criterion method, which can optimize a convex function under inequality conditions. Although such an optimality criterion method is not described here, the distribution of the regularized density $x_e$ of each element obtained using the above formulae (2) has an optimal three-dimensional shape structure.

Figure 7:
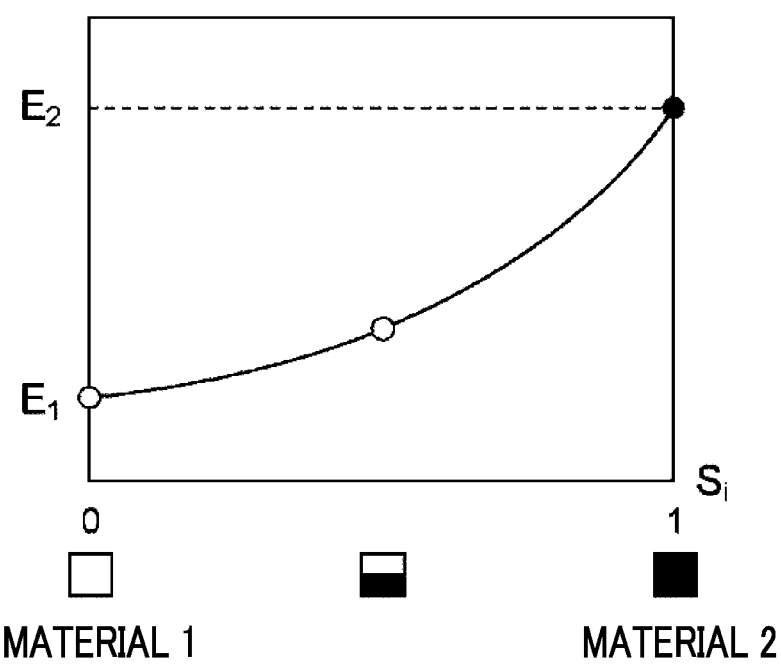
FIG. 7 is a diagram for describing an optimization method.

The SIMP method described above is a model for a single modeling material, but, for example, as illustrated in FIG. 7, the three-dimensional shape structure composed of two types of modeling materials is optimized by using Young's modulus as indicated in the following equation (3) in which the proportion of two types of modeling materials 1 and 2 is changed.

$$E(s_i) = (1 - s_i^p) E_1 + s_i^p E_2 \qquad (3)$$

Here, $E_1$ is Young's modulus of the first modeling material, $E_2$ is Young's modulus of the second modeling material, and Si is the relative regularized density of the second modeling material with respect to the first modeling material.

Next, processing for optimizing heat conductivity of the three-dimensional shape will be described.

In the optimization processing of the heat conductivity, a heat conduction equation obtained by rewriting the above formulae (2) which is the equation for the optimization processing of the rigidity described above is used. In this case, the equation is the same as the above formulae (2), but the meaning of each of parameters is different. That is, the objective function c(x) is the sum of thermal energy, K is a whole heat conduction matrix, U is a whole temperature vector, F is a whole heat flux vector, $k_0$ is a heat conduction tensor, and $u_e$ is a temperature gradient in an element e.

Next, processing for optimizing toughness of the three-dimensional shape will be described.

In the optimization processing of the toughness, the following equation (4) is used.

$$f = \sum_{n=1}^{n_{step}} f_n(s) = \sum_{n=1}^{n_{step}} \sum_{e=1}^{N} \sigma_{n,e} \cdot \varepsilon_{n,e} \qquad (4)$$

Here, f is an objective function, and $f_n$ (s) is an objective function in time s in all time steps. Also, $\sigma_{n,e}$ and $\varepsilon_{n,e}$ respectively means the e-th stress and strain in all N elements in the n-th step in all time steps $n_{step}$.

The dividing section 46 corresponds to the second modeling material having a resolution lower than the resolution of the first modeling material and divides the three-dimensional shape into the second elements, where the second element has a size larger than the first element.

In the present exemplary embodiment, a case where the three-dimensional shape of a modeling object is modeled by a first modeling material N1 of a resolution R1 (hereinafter, may be simply referred to as material N1) and a second modeling material N2 (hereinafter, may be simply referred to as material N2) of a resolution R2 (>R1) will be described.

The generating section 48 generates the three-dimensional shape data by setting the modeling materials of the first element and the second element according to the number of the first elements covered by the second element. Specifically, for example, the generating section 48 sets the second modeling material as the modeling material for the second element in a case where, among the plural first elements covered by the second element, the number of the first elements for which the second modeling material is set is equal to or more than the threshold.

The second optimization processing section 50 performs the same optimization processing as the first optimization processing section 44 for the three-dimensional shape data generated by the generating section 48. The second optimization processing section is an example of the optimization processing section. Also, the second optimization processing section 50 may perform the optimization processing for optimizing the predetermined objective function for each of the plural three-dimensional shape data generated by changing the threshold in a predetermined range. In this case, the generating section 48 sets the modeling material for the second element using the threshold for which the objective function is optimized.

The first receiving section 52 receives the resolution of the first modeling material and the resolution of the second modeling material. In this case, the acquiring section 41 generates the element data generated by dividing the three-dimensional shape into the first elements, where the first element corresponds to the resolution of the first modeling material received in the first receiving section 52, and the dividing section 46 divides the three-dimensional shape into the second elements, where the second element corresponds to the resolution of the second modeling material received in the first receiving section 52.

The second receiving section 54 receives the threshold. In this case, the generating section 48 sets the second modeling material as the modeling material for the second element in a case where, among the plural first elements covered by the second element, the number of the first elements for which the second modeling material is set is equal to or more than the threshold received by the second receiving section 54.

The third receiving section 56 receives information on what type optimization processing is. Examples of the type of the optimization processing include, but are not limited to, rigidity optimization processing as mentioned above, heat conductivity optimization processing, and toughness optimization processing. In this case, the second optimization processing section 50 performs optimization processing using an optimization method corresponding to the information received by the third receiving section 56 on what type optimization processing is.

In a case where the plural modeling materials are three types or more, the control section 58 selects two types of modeling materials in descending order of the resolution, and performs a control such that dividing processing of the three-dimensional shape by the dividing section 46 and generation processing of the three-dimensional shape data by the generating section 48 are repeated with respect to the first element and the second element corresponding to the resolutions of the two types of the modeling materials, respectively.

The three-dimensional modeling apparatus 100 models a three-dimensional shape under modeling conditions according to the three-dimensional shape data generated by the three-dimensional shape data generating apparatus 10.

In addition, as a three-dimensional modeling method for modeling a three-dimensional shape, for example, a fused deposition modeling method (FDM) for modeling the three-dimensional shape by melting and stacking a thermoplastic resin, a selective laser sintering (SLS) for modeling the three-dimensional shape by irradiating a powder metal material with a laser beam for sintering it, a stereolithography, an inkjet method, a heat melt deposition modeling method, and a powder sticking method, and the like are applied. However, other three-dimensional modeling methods may be used. In the present exemplary embodiment, a case of modeling a three-dimensional shape by using the fused deposition modeling method will be described as an example.

Next, the three-dimensional modeling apparatus 100 will be described.

Figure 8:
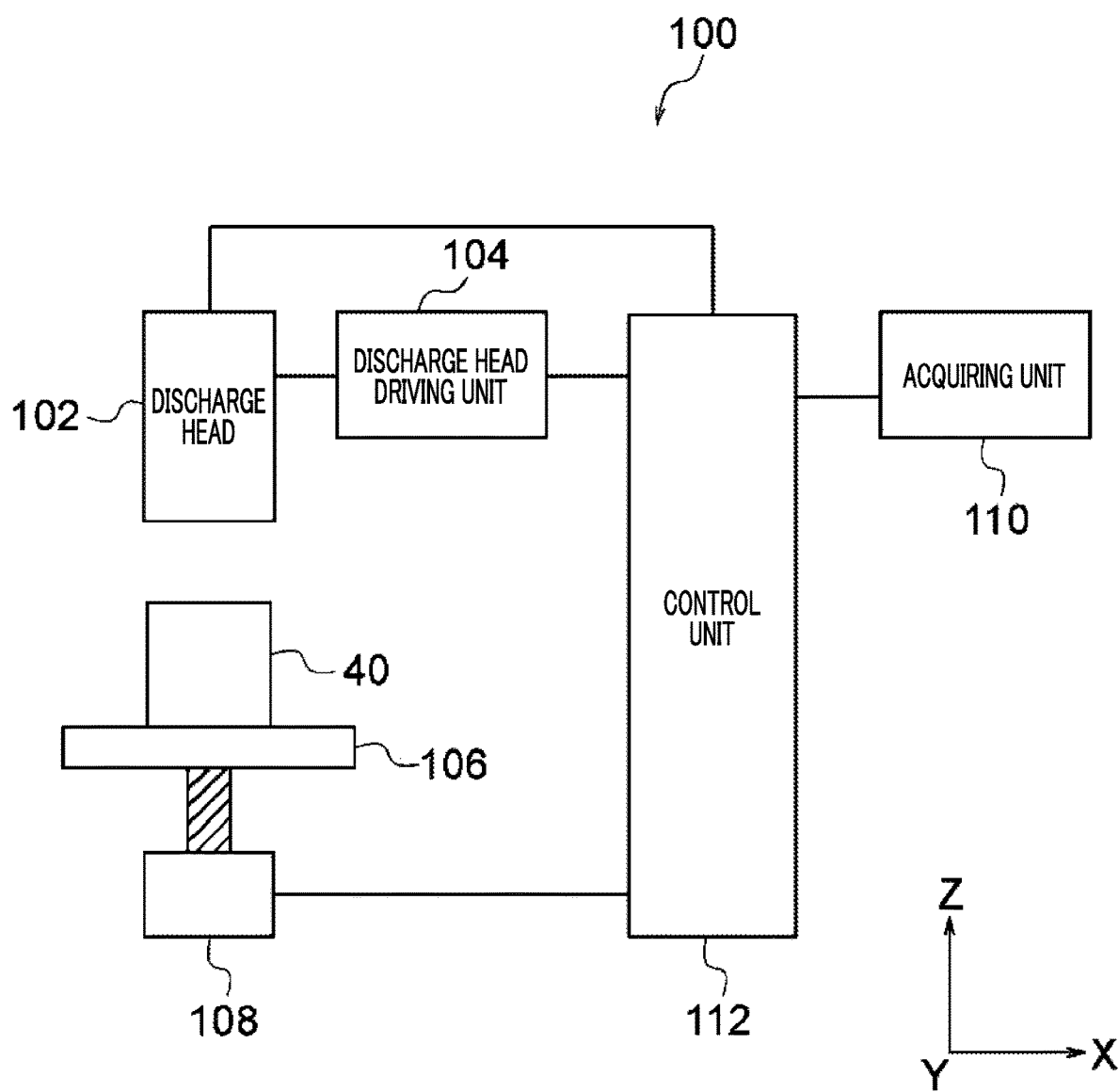
FIG. 8 is a configuration diagram of a three-dimensional modeling apparatus.

FIG. 8 illustrates a configuration of the three-dimensional modeling apparatus 100 according to the present exemplary embodiment. The three-dimensional modeling apparatus 100 is an apparatus modeling the three-dimensional shape by the fused deposition modeling method.

As illustrated in FIG. 8, the three-dimensional modeling apparatus 100 includes a discharge head 102, a discharge head driving unit 104, a modeling table 106, a modeling table driving unit 108, an acquiring section 110, and a control section 112. The discharge head 102, the discharge head driving unit 104, the modeling table 106, and the modeling table driving unit 108 are examples of modeling units.

The discharge head 102 includes plural modeling material discharge heads discharging plural types of modeling materials for modeling a three-dimensional shape 40 and a support material discharge head discharging a support material. The support material is used for supporting an overhang portion (also referred to as "projection") of the three-dimensional shape until modeling is completed and is removed after completion of the modeling.

The discharge head driving unit 104 drives the discharge head 102 and the discharge head 102 performs scanning on an XY plane two-dimensionally.

The modeling table driving unit 108 drives the modeling table 106 and the modeling table 106 is moved up and down in the Z axial direction.

The acquiring section 110 acquires the three-dimensional shape data and the support material data generated by the three-dimensional shape data generating apparatus 10.

The control section 112 controls the driving of the discharge head driving unit 104 to cause the discharge head 102 to perform the two-dimensional scanning and controls the discharge head 102 to discharge the modeling material and the support material, such that the modeling material is discharged according to the three-dimensional shape data acquired by the acquiring section 110 and the support material is discharged according to the support material data.

In addition, every time the modeling of each of layers is completed, the control section 112 drives the modeling table driving unit 108 to move down the modeling table 106 at a predetermined stacking interval. Therefore, a three-dimensional shape based on the three-dimensional shape data is modeled.

Figure 9:
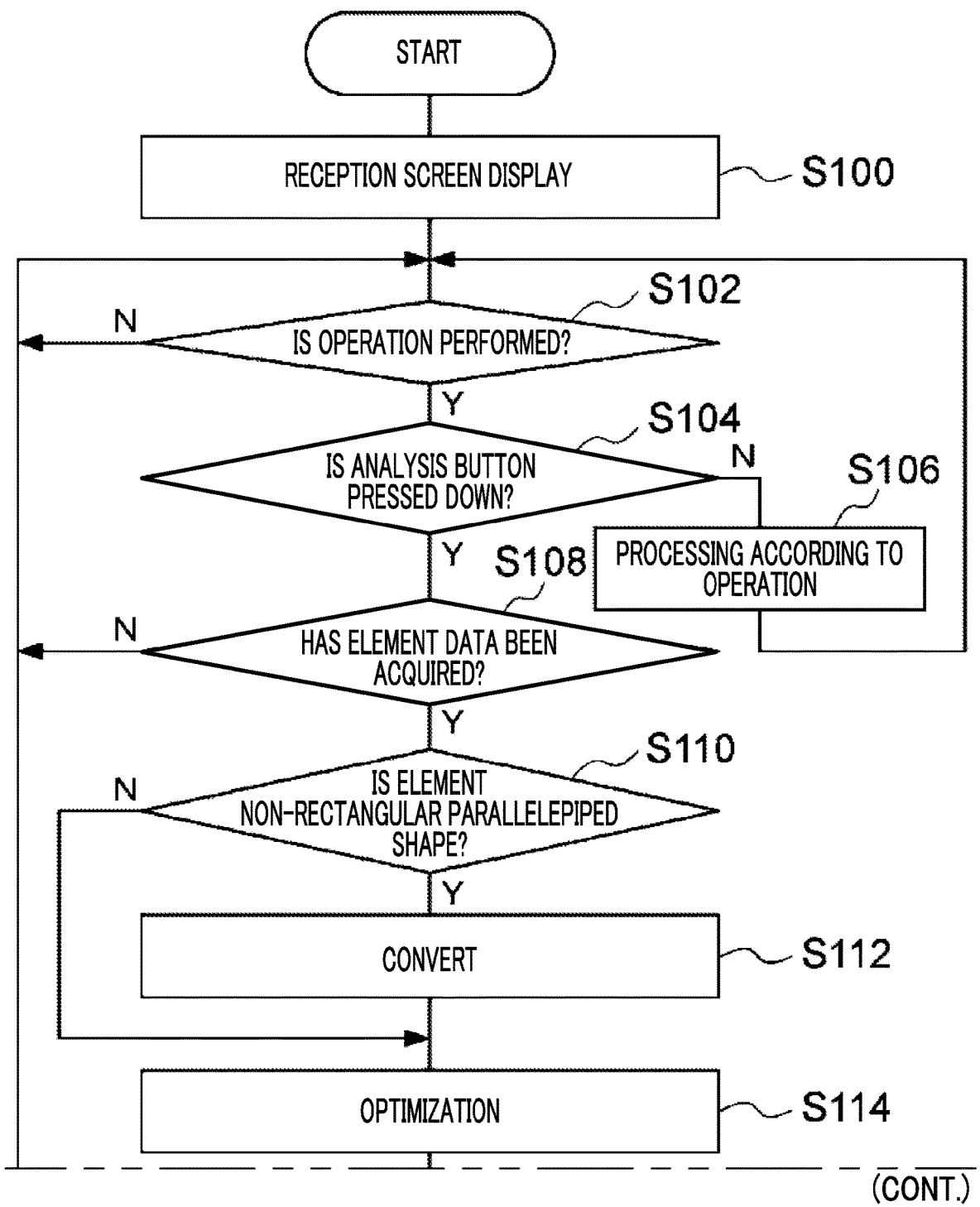
FIG. 9 is a flowchart illustrating a flow of processing by three-dimensional shape data generating program.

Next, operations of the generating apparatus 10 according to the present exemplary embodiment will be described with reference to FIG. 9. The generation processing illustrated in FIG. 9 is executed by causing the CPU 12A to execute the three-dimensional shape data generating program. Also, the generation processing illustrated in FIG. 9 is executed, for example, in a case where execution of the generating program is instructed by an operation of a user. In the present exemplary embodiment, the description of a support material data generation processing is omitted.

Figure 10:
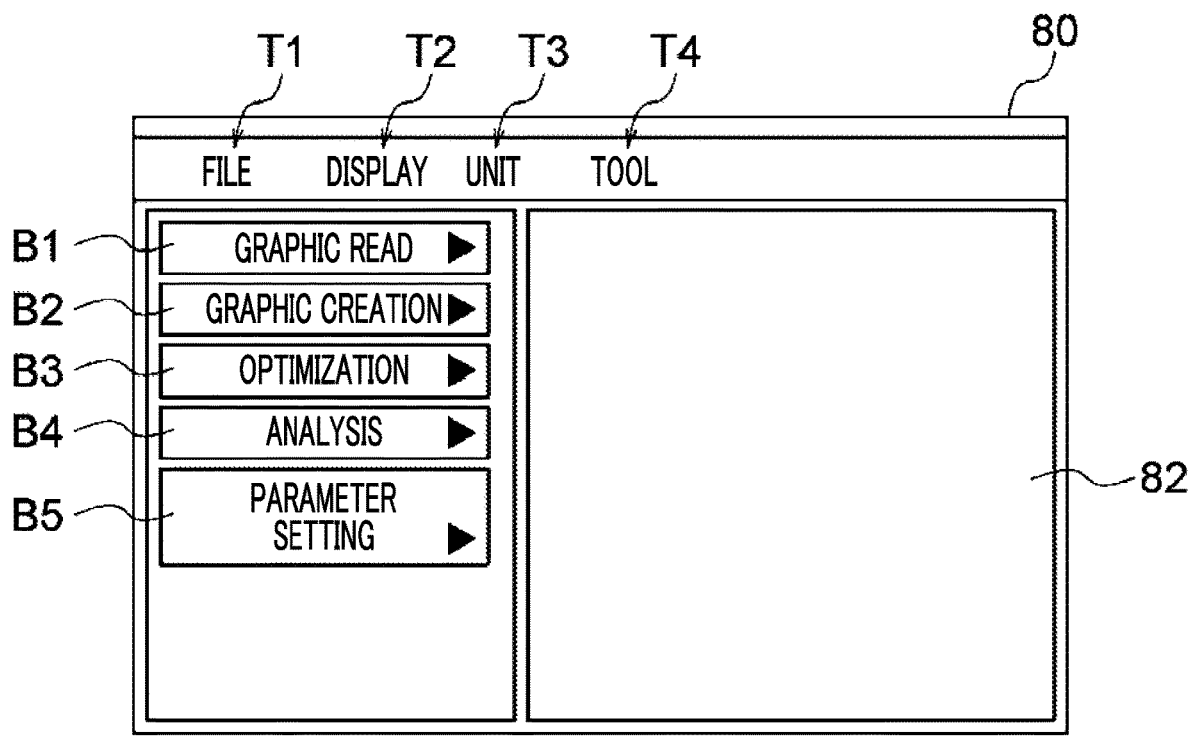
FIG. 10 is a diagram illustrating an example of a reception screen.

In step S100, a reception screen 80 as illustrated in FIG. 10 is displayed in the display unit 16. As illustrated in FIG. 10, the reception screen 80 includes a graphic read button B1, a graphic creation button B2, an optimization button B3, an analysis button B4, a parameter setting button B5, a file tab T1, a display tab T2, a unit tab T3, a tool tab T4, and a display area 82.

In step S102, it is determined whether or not an operation is performed by a user. In a case where the operation is performed, the process proceeds to step S104 and in a case where the operation is not performed, the process waits until the operation is performed.

In step S104, it is determined whether or not an operation is pressing-down of the analysis button B4. In a case where the operation is an operation other than the pressing-down of the analysis button B4, the process proceeds to step S106, and in a case where the operation is the pressing-down of the analysis button B4, the process proceeds to step S108.

In step S106, processing according to the operation is performed. For example, in a case where the graphic read button B1 is pressed down, processing for reading element data from the storage unit 20 is executed. Specifically, in a case where a user presses down the graphic read button B1, a screen (not illustrated) for selecting desired element data from the element data stored in the storage unit 20 is displayed. And in a case where a user selects the desired element data, the selected element data is read, and the three-dimensional shape represented by the read element data is displayed in the display area 82. The element data may be acquired from an external apparatus via the communication unit 18.

Figure 11:
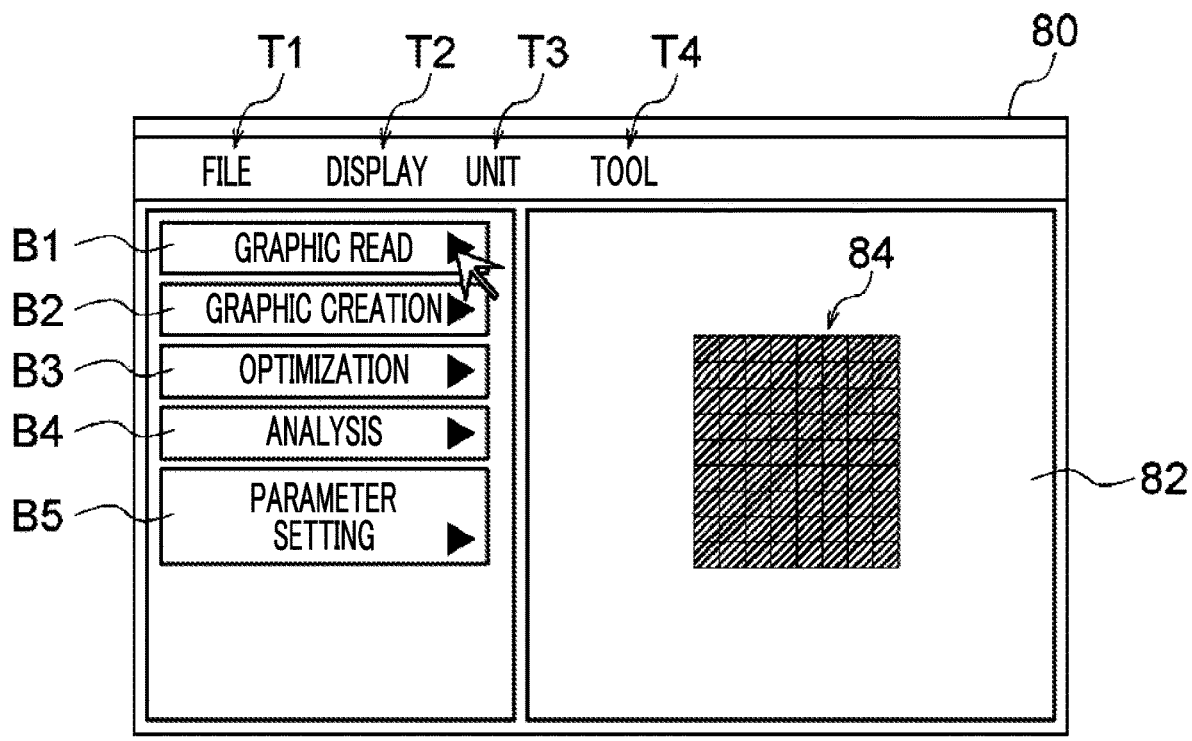
FIG. 11 is a diagram illustrating an example of a reception screen.

In FIG. 11, an example in which a three-dimensional shape 84 is displayed in the display area 82 is illustrated. In FIG. 11, the three-dimensional shape 84 is displayed in a plan view. However, the three-dimensional shape 84 may be displayed in three-dimensions.

In a case where the graphic creation button B2 is pressed down, a screen (not illustrated) for a user to create element data is displayed, the element data of a three-dimensional shape is created according to the operation of the user, and the element data is stored in the storage unit 20.

Figure 12:
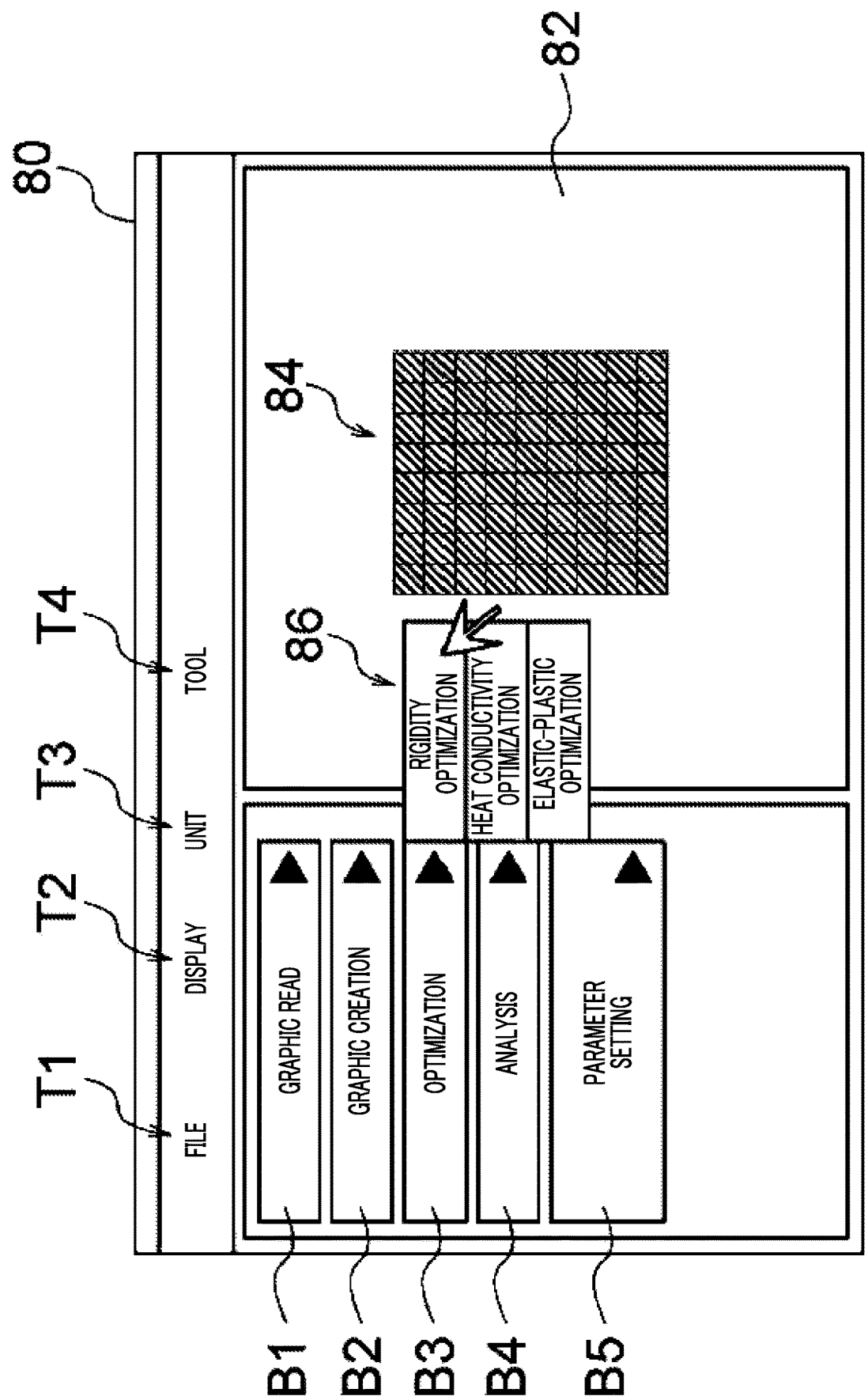
FIG. 12 is a diagram illustrating an example of a reception screen.

In a case where the optimization button B3 is pressed down, a pull-down menu 86 for selecting an optimization method is displayed to allow the user to make a selection, as illustrated in FIG. 12. In the example of FIG. 12, three types of optimization methods, that is, a rigidity optimization, a heat conductivity optimization, and an elastic-plastic optimization can be selected, but the type of optimization method is not limited thereto. A type of an optimization method selected by the user is stored in the storage unit 20.

Figure 13:
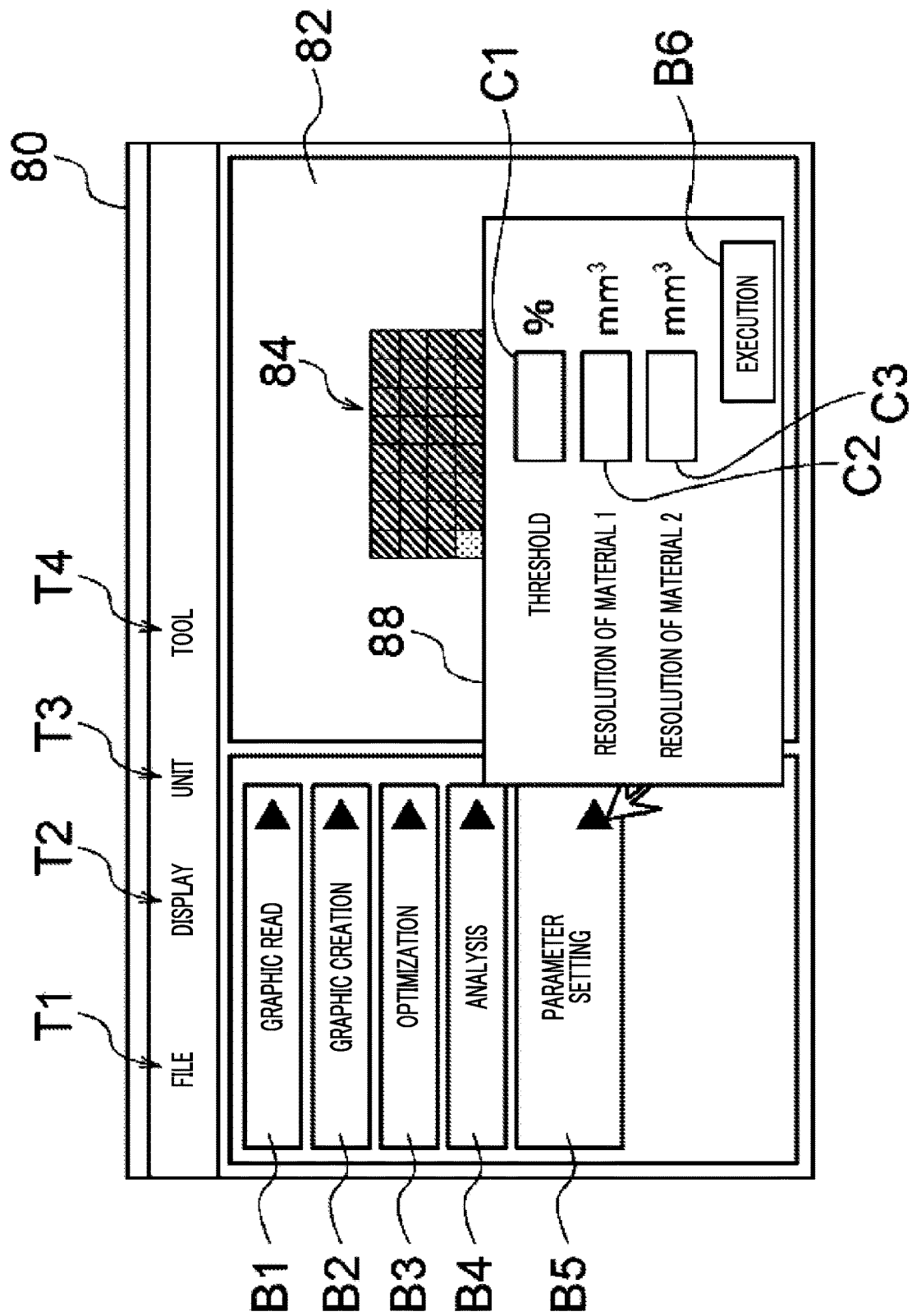
FIG. 13 is a diagram illustrating an example of a reception screen.

In a case where the parameter setting button B5 is pressed down, a parameter setting screen 88 is displayed to allow the user to make an input, as illustrated in FIG. 13. In the example of FIG. 13, the parameter setting screen 88 includes an input field C1 for inputting a threshold, input fields C2 and C3 for inputting resolutions of two types of modeling materials, and an execution button B6. The user inputs a desired value into the appropriate input fields C1 to C3 and presses down the execution button B6. Therefore, values input by the user are stored in the storage unit 20.

In step S108, it is determined whether or not element data has been acquired. Specifically, it is determined whether or not a user reads element data in step S106 by pressing down the graphic read button B1 in the reception screen 80 of FIG. 10, and whether or not the user creates the element data in step S106 by pressing down the graphic creation button B2. In a case where the element data has been acquired by reading and creating the element data, the process proceeds to step S110 and in a case where the element data has not been acquired, the process returns to step S102.

In step S110, it is determined whether or not the first element represented in the element data acquired is a non-rectangular parallelepiped shape, that is, the first element is a shape other than a hexahedron. In a case where the first element is the non-rectangular parallelepiped shape, the process proceeds to step S112 and in a case where the first element is the hexahedron, that is, a rectangular parallelepiped shape, the process proceeds to step S114.

Figure 14:
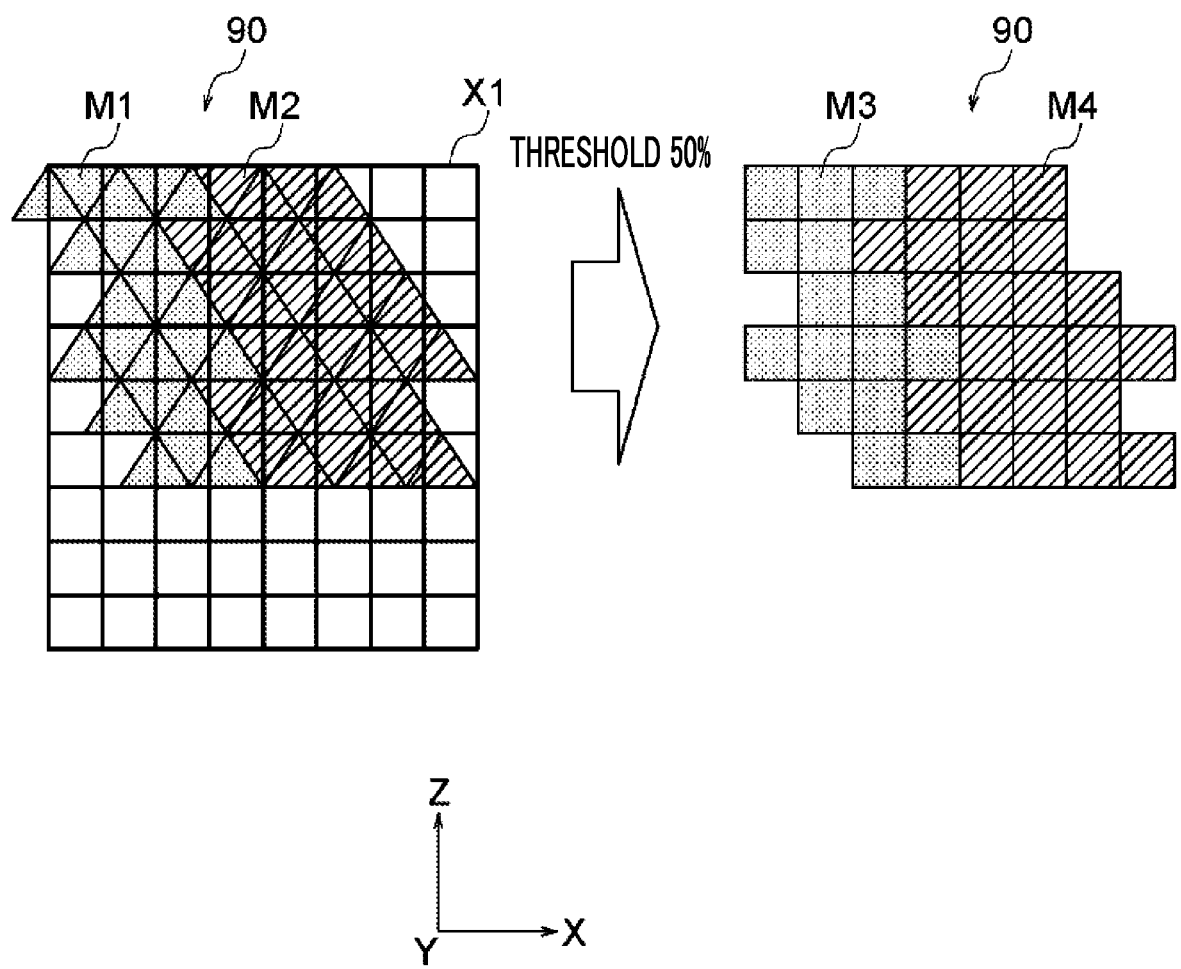
FIG. 14 is a diagram for describing a case of converting a non-rectangular parallelepiped shape element into a rectangular parallelepiped shape element.

In step S112, the first element of the non-rectangular parallelepiped shape is converted into an element of a rectangular parallelepiped shape corresponding to the resolution of the material N1. For example, a three-dimensional shape 90 illustrated in FIG. 14 is considered. For the purpose of simplifying the description in the following, the three-dimensional shape 90 on an XZ plane will be described, rather than a three-dimensional space.

The three-dimensional shape 90 is composed of the first element M1 in which the material N1 of the resolution R1 is set and the first element M2 in which the material N2 of the resolution R2 is set. The first elements M1 and M2 have a tetrahedron shape. In this case, as illustrated in FIG. 14, the first elements M1 and M2 of the tetrahedron shape are converted into first elements M3 and M4 of a rectangular parallelepiped shape. The first elements M3 and M4 are elements of a size corresponding to the resolution R1. In addition, as illustrated in FIG. 14, at the time of converting, in a case where the three-dimensional shape 90 is divided into first elements X1, where the first element X1 has the same size as the first elements M3 and M4 of the rectangular parallelepiped shape, the modeling material is set to the first elements M3 and M4 of the rectangular parallelepiped shape, according to the number of first elements M1 and M2 of a non-rectangular parallelepiped shape covered by the first elements X1 of the rectangular parallelepiped shape. In the example of FIG. 14, a threshold is 50% (½). That is, in a case where the number of the first elements M1 of the non-rectangular parallelepiped shape covered by the first elements X1 of the rectangular parallelepiped shape is equal to or larger than 50%, the material N1 of the first element M1 is set for the first element X1. In a case where the number of the first elements M2 of the non-rectangular parallelepiped shape covered by the first elements X1 of the rectangular parallelepiped shape is equal to or larger than 50%, the material N2 of the first element M2 is set for the first element X1. Therefore, as illustrated in FIG. 14, a three-dimensional shape 92 composed of the rectangular parallelepiped shape first elements M3 and M4 is generated.

In step S114, the optimization processing is performed to optimize the three-dimensional shape structure represented by the element data acquired in step S106 or step S112. That is, optimization processing is performed such that the objective function set according to an optimization method is optimized. Here, the optimization method selected in step S106 by the user pressing down the analysis button B4 is used. Also, in a case where the optimization method is not selected by the user, a predetermined optimization method is used.

Figure 15:
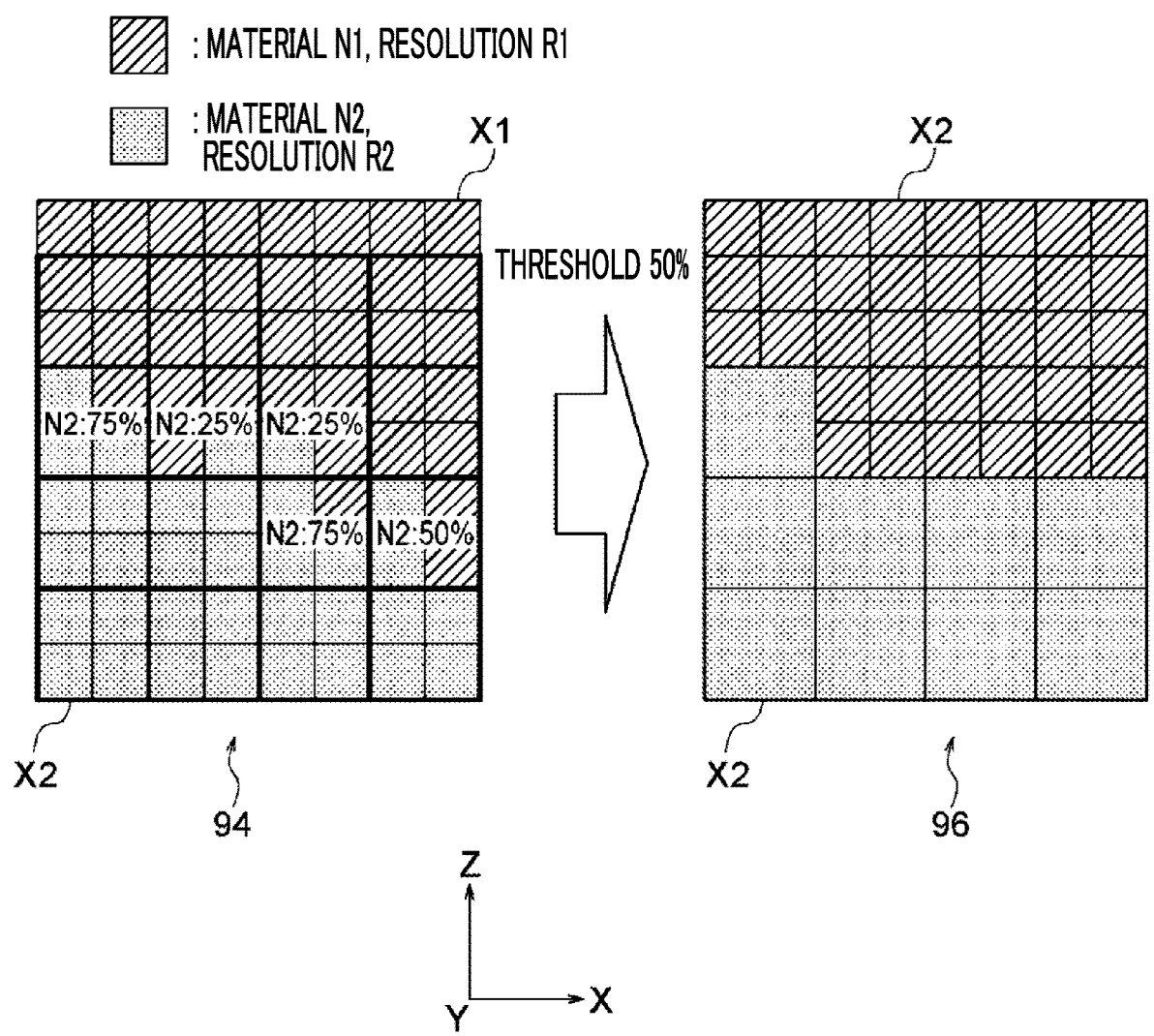
FIG. 15 is a diagram for describing setting of a modeling material.

In step S116, as illustrated in FIG. 15, a three-dimensional shape 94 is divided into second elements X2, where the second element X2 corresponds to the material N2 of the resolution R2 lower than the resolution R1 of the material N1 and has a size larger than the first element X1. In the example of FIG. 15, on the XZ plane, the four first elements X1 are covered by the second element X2.

Step S118, according to the number of the first elements X1 covered by the second element X2, the three-dimensional shape data is generated by setting the modeling materials of the first element X1 and the second element X2, respectively. Specifically, in a case where, among plural first elements X1 covered by the second element X2, the number of the first elements X1 for which the material N2 of the resolution R2 is set equal to or more than a threshold, the material N2 is set as the modeling material for the second element X2.

For example, in the example of FIG. 15, a threshold is 50% (½). Therefore, as illustrated in FIG. 15, where the number of the first elements X1 for which the material N1 is set and which are covered by the second element X2 is more than two (at least 50%), the material N1 is set for all the first elements X1 covered by the second element X2. On the other hand, where the number of the first elements X1 for which the material N2 is set and which are covered by the second element X2 is more than two (at least 50%), the material N2 is set for the second element X2. Therefore, as illustrated in FIG. 15, the three-dimensional shape data of a three-dimensional shape 96 composed of the first elements X1 and the second elements X2, which have different sizes from each other, is generated.

In step S120, the same optimization processing as that in step S114 is performed on the three-dimensional shape data generated in step S118. Therefore, the three-dimensional shape data of the three-dimensional shape in which the objective function set according to an optimization method is optimized is obtained.

Figure 16:
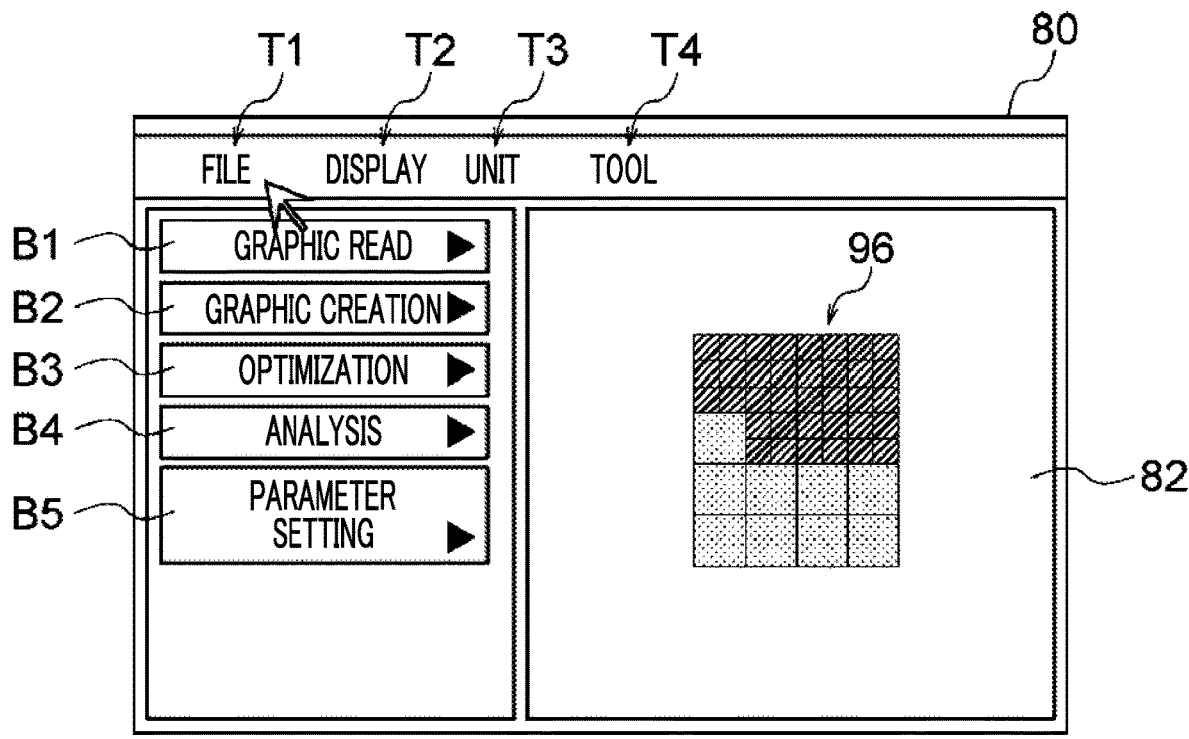
FIG. 16 is a diagram illustrating an example of a reception screen.

In step S122, the three-dimensional shape data obtained in step S120 is stored in the storage unit 20 and, as illustrated in FIG. 16, the three-dimensional shape 96 represented by the three-dimensional shape data is displayed in the display area 82 of the reception screen 80. The user may cause the storage unit 20 to store the three-dimensional shape data with a file name by pressing down the file tab T1.

In step S124, it is determined whether or not an operation by the user instructing the end of processing is performed. In a case where the instruction is given, the present routine ends, and in a case where the instruction is not given, the process returns to step S102 and the same process as that described above is repeated.

Plural three-dimensional shape data are generated by changing the threshold used in processing of step S118 in a predetermined range and the optimization processing of step S120 may be performed for each of the plural three-dimensional shape data generated. In addition, in step S122, the three-dimensional shape data in which the material is set using the threshold allowing an objective function to be most optimized, among plural thresholds, may be stored in the storage unit 20, and the three-dimensional shape represented by three-dimensional shape data may be displayed in the display area 82 of the reception screen 80.

Figure 17:
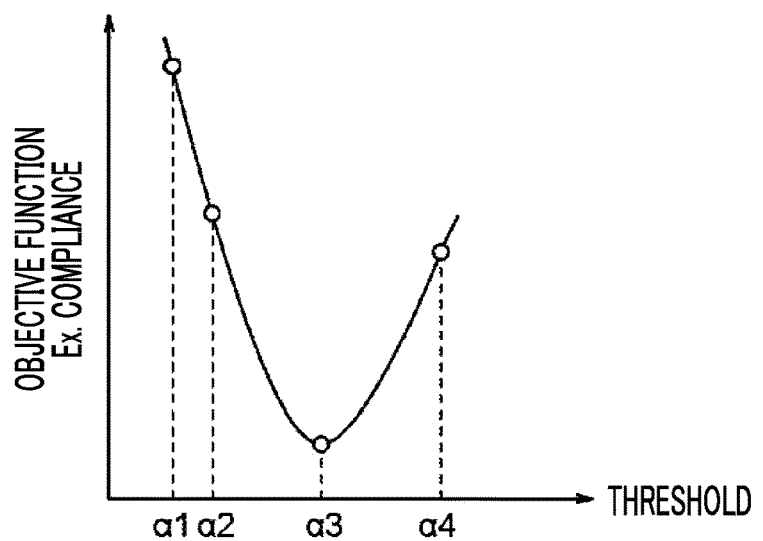
FIG. 17 is a line diagram illustrating a relationship between a threshold and an objective function.

For example, as illustrated in FIG. 17, in a case where the optimization processing is performed by changing the threshold from α1 to α4 and generating plural three-dimensional shape data, the three-dimensional shape data in which the material is set using the threshold α3 allowing the objective function to be the smallest is stored in the storage unit 20 and the three-dimensional shape represented by the three-dimensional shape data is displayed in the display area 82 of the reception screen 80.

Figure 18:
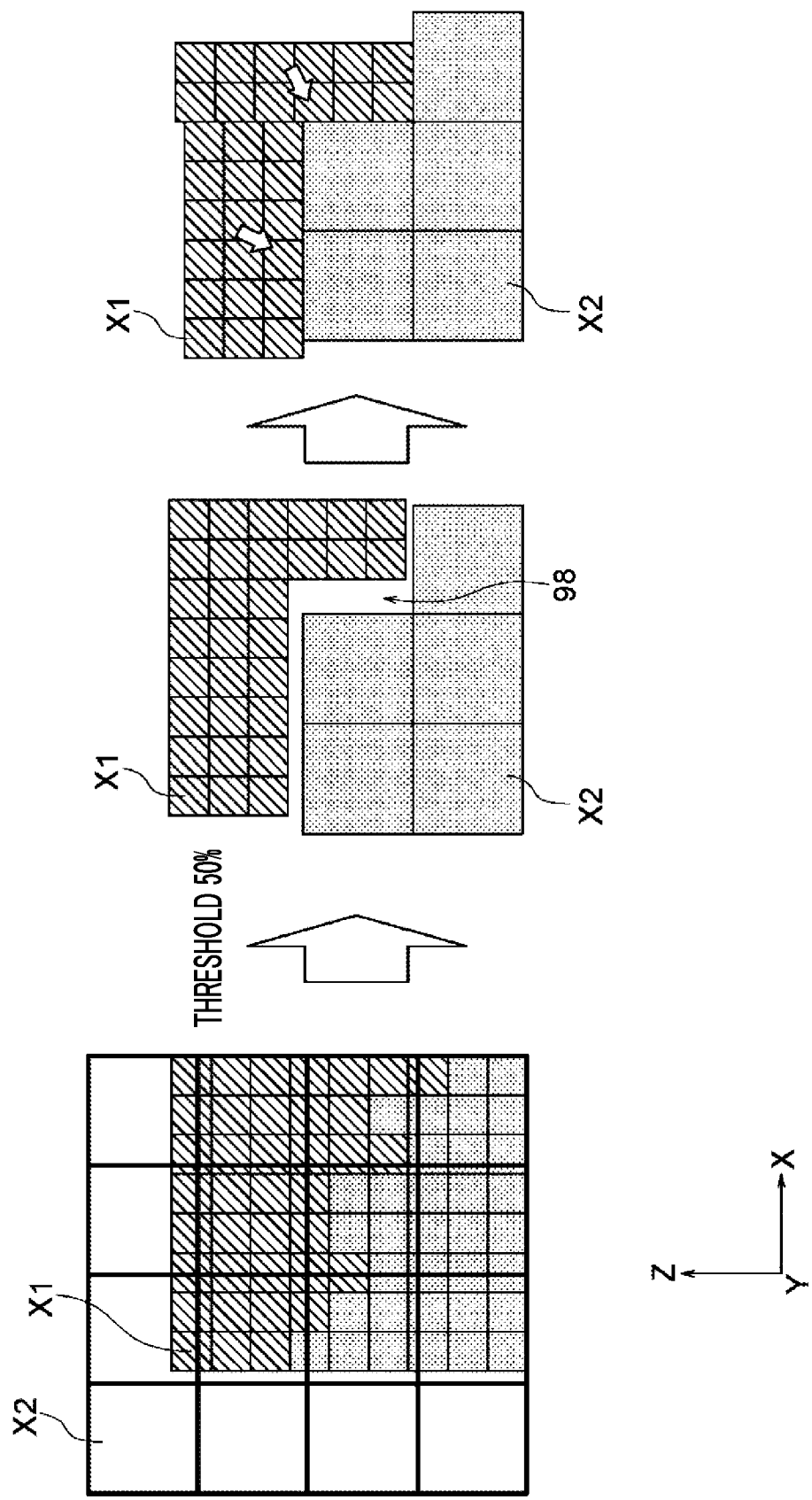
FIG. 18 is a diagram for describing a gap occurring among plural materials.

In a case where the size of the second element is a non-integer multiple of the size of the first element, at least one of the first and second elements may be shifted such that no gap occurs between the first and second elements. For example, as illustrated on the left side of FIG. 18, the size of the second element X2 is a non-integer multiple of the size of the first element X1 in some cases. In this case, when the material is set by the processing of step S118 of FIG. 9, as illustrated in the central Figure of FIG. 18, a gap 98 occurs at the boundary between the first element X1 and the second element X2 in some cases. As illustrated on the right side of FIG. 18, for example, the first element X1 is shifted such that the gap 98 does not occur. Additionally, the second element X2 may be shifted, or both the first element X1 and the second element X2 may be shifted.

In step S116, when the size of the second element is a non-integer multiple of the size of the first element, the three-dimensional shape may be divided in plural patterns while reference positions, which are provided when the three-dimensional shape is divided into the second elements, are shifted by a distance smaller than the size of the first element.

Figure 19:
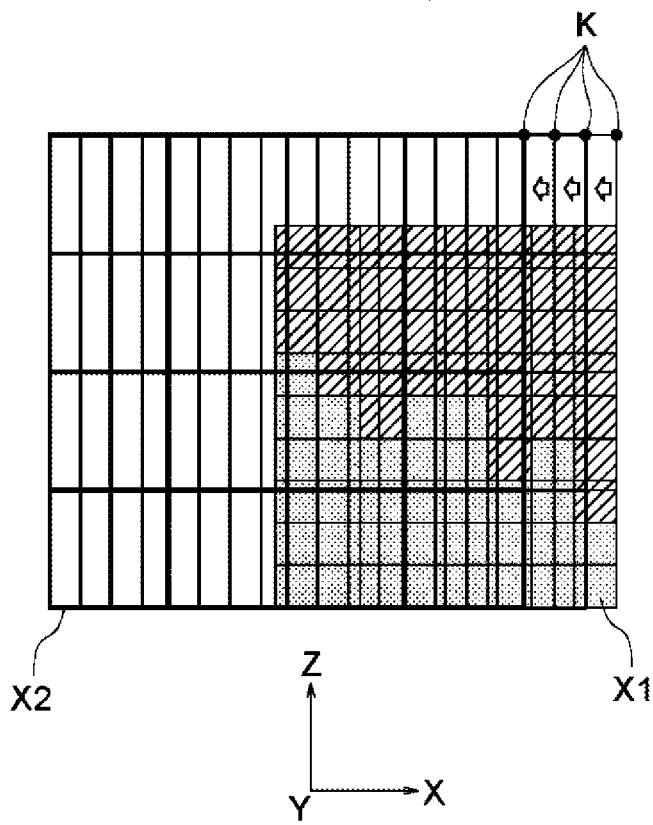
FIG. 19 is a diagram for describing a case of moving a reference position.

For example, as illustrated in FIG. 19, when the size of the second element X2 is a non-integer multiple of the size of the first element X1, the three-dimensional shape is divided in plural patterns while reference positions K, which are provided when the three-dimensional shape is divided into the second elements X2, are shifted by a distance smaller than the size of the first element X1. FIG. 19 illustrates an example where the reference positions K are shifted in the X axial direction.

In this case, in step S118, the three-dimensional shape data are generated in plural patterns, and in step S120, optimization processing is performed for each of the plural patterns of the three-dimensional shape data. Among the plural three-dimensional shape data on which the optimization processing has been performed, the processing of step S122 is performed on the three-dimensional shape data with the most optimized objective function. Also, for each of the reference positions, plural three-dimensional shape data is generated by changing the threshold used in the processing of step S118 in a predetermined range and the optimization processing of step S120 may be performed for each of the plural three-dimensional shape data generated. Among plural thresholds in each of the reference positions, the processing of step S122 may be performed for the three-dimensional shape data in which the material is set using the threshold allowing the objective function to be the most optimized.

Figure 20:
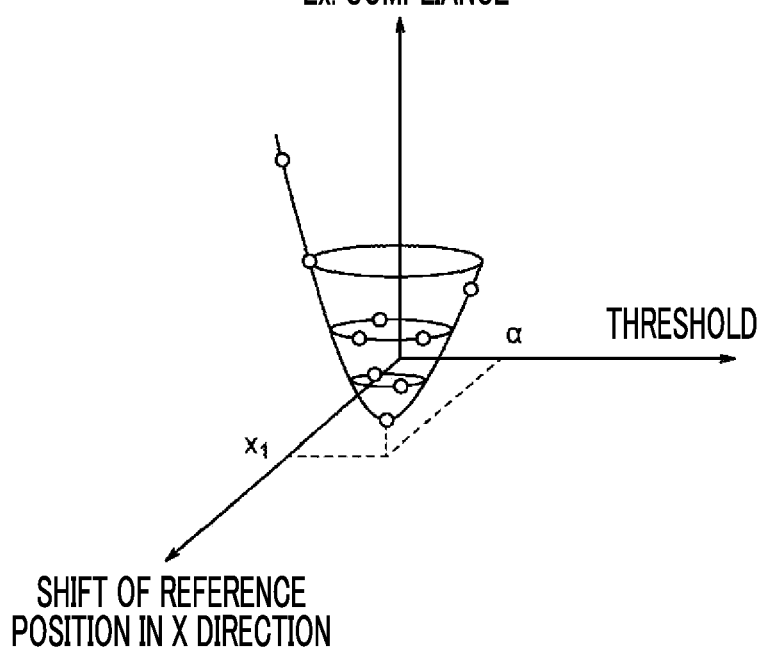
FIG. 20 is a line diagram illustrating a relationship between a threshold, shift of reference position in an X direction, and an objective function.

For example, as illustrated in FIG. 20, among combinations of a threshold and shift of a reference position in the X direction, the processing of step S122 is performed for three-dimensional shape data corresponding to a combination of a reference position X1 and a threshold α at which an objective function is the smallest.

While FIG. 19 illustrates a case where the reference positions are shifted in X axial direction, the three-dimensional shape may also be divided in plural patterns while the reference positions are shifted in the Y axial direction and the Z axial direction. Also in this case, for each of the reference positions, plural three-dimensional shape data is generated by changing the threshold used in the processing of step S118 in a predetermined range and the optimization processing of step S120 may be performed for each of the plural three-dimensional shape data generated.

The acquiring section 110 of the three-dimensional modeling apparatus 100 acquires the three-dimensional shape data transmitted from the three-dimensional shape data generating apparatus 10. Also, the control section 112 controls the driving of the discharge head driving unit 104 to cause the discharge head 102 to perform the two-dimensional scanning, and controls the discharge head 102 to discharge the modeling material, such that the modeling material is discharged according to the three-dimensional shape data acquired by the acquiring section 110. In this way, the three-dimensional shape is modeled.

Although the present disclosure has been described using respective exemplary embodiments, the present disclosure is not limited to the scopes described in the exemplary embodiments. Various modifications or improvements can be made to the exemplary embodiments without departing from the spirit of the present disclosure and forms to which modification or improvement are applied are also covered by the technical scope of the present disclosure.

For example, in the present exemplary embodiment, the modeling materials have been described to have two types, but the modeling materials may have three or more types. In this case, two types of modeling materials are selected in descending order of the resolution and dividing processing of step S116 and the generation processing of the three-dimensional shape data of step S118 are repeated for the first element and the second element corresponding to the resolutions of the two types of the modeling materials, respectively.

For example, the three-dimensional shape structure composed of the three types of modeling materials is optimized by using Young's modulus shown in the following equation (5) in which the ratio of the three types of modeling materials 1 to 3 is changed.

$$E = (1 - s_1^q)E_1 + s_1^q E_{23} \quad (5)$$
$$= (1 - s_1^q)E_1 + s_1^q[(1 - s_1^p)E_2 + s_2^p E_3]$$

Here, $E_1$ is Young's modulus of the first modeling material, $E_2$ is Young's modulus of the second modeling material, $E_3$ is Young's modulus of the third modeling material, $E_{23}$ is an effective Young's modulus of a two-phase composite material composed of the second modeling material and the third modeling material.

Figure 21:
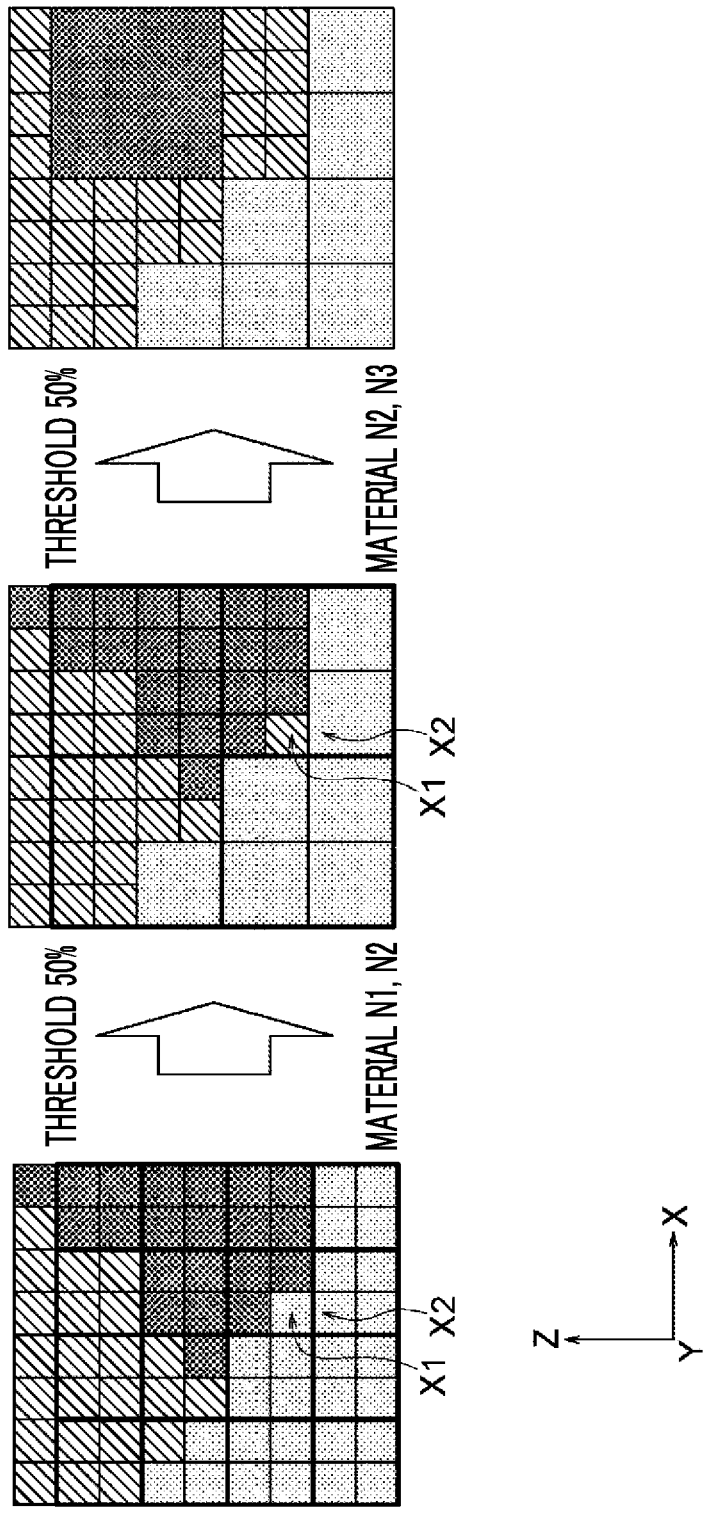
FIG. 21 is a diagram for describing setting of a three-dimensional shape material having three types of materials.

For example, as illustrated in FIG. 21, in a case of a three-dimensional shape composed of materials N1 to N3 of three types of resolutions R1 to R3 (R1<R2<R3), first, the processing of step S118 is performed for the first element X1 and the second element X2 correspond to materials N1 and N2, respectively, in descending order of resolution. Next, the same processing is performed for the materials N2 and N3.

Figure 22:
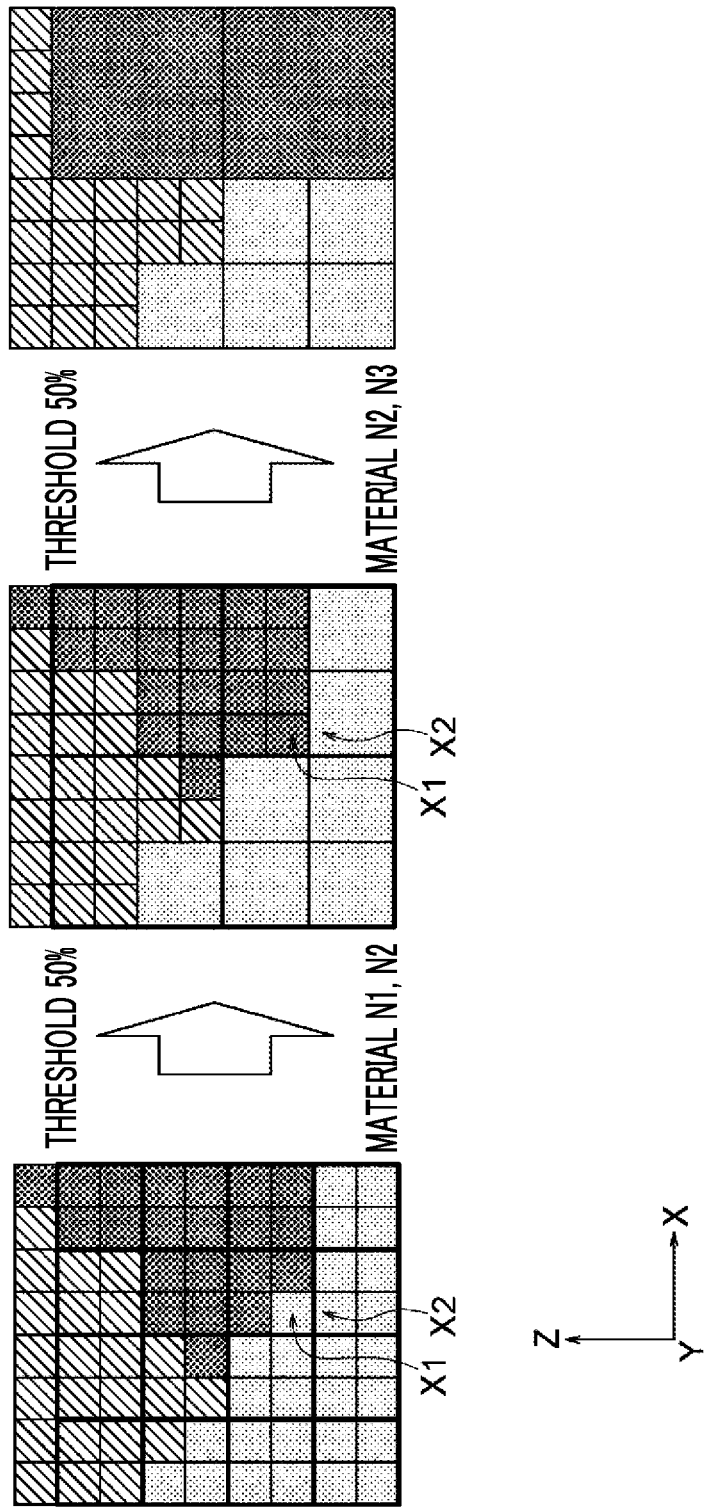
FIG. 22 is a diagram for describing setting of a three-dimensional shape material having three types of materials.

In this case, for example, the second element X2 indicated by the arrow in the left figure of FIG. 21 includes one first element X1 of the material N2 and three first elements X1 of the material N3. In addition, in a case where a threshold is 50%, the number of first elements X1 of the material N2 covered by the second element X2 is less than the threshold and therefore, the second element X2 indicated by the arrow in the left figure of FIG. 21 cannot be set to the material N2. In this case, the first element X1 indicated by the arrow in the left figure of FIG. 21 may set the material N1 having the smallest resolution, as the first element X1 indicated by the arrow in the central figure of FIG. 21. On the other hand, as illustrated in FIG. 22, the first element X1 indicated by the arrow in the left figure of FIG. 22 may set the material N3 having the biggest resolution, as the first element X1 indicated by the arrow in the central figure of FIG. 22. The processing of step S118 in the materials N2 and N3 is also the same.

For example, in the present exemplary embodiment, a case where the generating apparatus 10 which generates the three-dimensional shape data and the three-dimensional modeling apparatus 100 which models the three-dimensional shape based on the three-dimensional shape data have been described to be separate from each other, but the three-dimensional modeling apparatus 100 may be configured to have the function of the generating apparatus 10.

That is, the acquiring section 110 of the three-dimensional modeling apparatus 100 may acquire the three-dimensional shape data, and the control section 112 may generate the three-dimensional shape data by executing the generation processing of FIG. 9.

In addition, for example, the generation processing of the three-dimensional shape data illustrated in FIG. 9 may be realized by hardware such as application specific integrated circuit (ASIC) and the like. In this case, a processing speed can be increased as compared with the case where the generating process is realized by software.

Further, in each of the exemplary embodiments, a situation in which the three-dimensional shape data generating program is installed in the storage unit 20 has been described, but the exemplary embodiment is not limited thereto. The three-dimensional shape data generating program according to the present exemplary embodiment also may be provided in the form of being recorded in a computer-readable storage medium. For example, the three-dimensional shape data generating program according to the exemplary embodiment of the present disclosure may be provided in the form of recorded data on an optical disc such as a compact disc (CD)-ROM, a digital versatile disc (DVD)-ROM, and the like or in a form of being recorded in a semiconductor memory such as a universal serial bus (USB) memory, a memory card, and the like. In addition, the three-dimensional shape data generating program according to the present exemplary embodiment may be acquired from an external apparatus via the communication line connected to the communication unit 18.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A three-dimensional shape data generating apparatus comprising:
   a processor configured to:
   acquire element data generated by dividing a three-dimensional shape into first elements, the three-dimensional shape being modeled with a plurality of modeling materials having different resolutions, each first element corresponding to a resolution of a first modeling material among the plurality of modeling materials;
   divide the three-dimensional shape into second elements, each second element corresponding to a second modeling material having a resolution lower than the resolution of the first modeling material and having a size larger than the first element; and
   generate three-dimensional shape data through setting modeling materials for the first and second elements, respectively, according to the number of the first elements covered by the second element by setting the second modeling material as the modeling material for the second element when, among a plurality of the first elements covered by the second element, the number of the first elements that is set to use the second modeling material is greater than or equal to than a predefined threshold.

2. The three-dimensional shape data generating apparatus according to claim 1, wherein
the processor is further configured to set the second modeling material as the modeling material for the second element when, among a plurality of the first elements covered by the second element, the number of the first elements for which the second modeling material is set is equal to or more than a threshold.

3. The three-dimensional shape data generating apparatus according to claim 2, wherein the processor is further configured to:
perform optimization processing to optimize a predetermined objective function for each of a plurality of three-dimensional shape data generated through changing the threshold in a predetermined range, and
set the modeling material for the second element using a threshold for which the objective function is optimized.

4. The three-dimensional shape data generating apparatus according to claim 3, wherein
when a size of the second element is a non-integer multiple of a size of the first element, the processor is further configured to divide the three-dimensional shape in a plurality of patterns while shifting reference positions by a distance smaller than the size of the first element, wherein the reference positions are provided when the three-dimensional shape is divided into the second elements,
the processor is further configured to generate the three-dimensional shape data in the plurality of patterns, and
the processor is further configured to perform the optimization processing for each of the plurality of patterns of the three-dimensional shape data.

5. The three-dimensional shape data generating apparatus according to claim 1, wherein
when a size of the second element is a non-integer multiple of a size of the first element, the processor is further configured to shift at least one of the first and second elements such that no gap occurs between the first and second elements.

6. The three-dimensional shape data generating apparatus according to claim 1, wherein the processor is further configured to:
when the first element is a non-rectangular parallelepiped shape element other than a rectangular parallelepiped, convert the first element into a rectangular parallelepiped shape element corresponding to the resolution of the first modeling material.

7. The three-dimensional shape data generating apparatus according to claim 6, wherein
when the three-dimensional shape is divided into the rectangular parallelepiped shape elements, the processor is further configured to generate the element data through setting the modeling material for each rectangular parallelepiped shape element according to the number of the non-rectangular parallelepiped shape elements covered by the rectangular parallelepiped shape element.

8. The three-dimensional shape data generating apparatus according to claim 1, wherein the processor is further configured to:
when the plurality of modeling materials are of three or more types, selects two types of modeling materials in descending order of the resolution,
perform a control such that with respect to the first and second elements corresponding to the resolutions of the two types of modeling materials,
repeatedly divide the three-dimensional shape, and
repeatedly generate the three-dimensional shape data.

9. The three-dimensional shape data generating apparatus according to claim 1, wherein the processor is further configured to:
receive the resolution of the first modeling material and the resolution of the second modeling material,
generate the element data by dividing the three-dimensional shape into the first elements that correspond to the resolution of the first modeling material received by the processor, and
divide the three-dimensional shape into the second elements that correspond to the resolution of the second modeling material received by the processor.

10. The three-dimensional shape data generating apparatus according to claim 2, wherein the processor is further configured to:
receive the threshold, and
set the second modeling material as the modeling material for the second element when, among the plurality of first elements covered by the second element, the number of the first elements for which the second modeling material is set is equal to or more than the threshold received by the processor.

11. The three-dimensional shape data generating apparatus according to claim 3, wherein the processor is further configured to:
receive information on what type the optimization processing is, and
perform the optimization processing using an optimization method corresponding to the information received by the processor on what type the optimization processing is.

12. A three-dimensional modeling apparatus comprising:
the three-dimensional shape data generating apparatus according to claim 1; and
a modeling unit that models a three-dimensional shape based on three-dimensional shape data generated by the three-dimensional shape data generating apparatus.

13. A non-transitory computer readable medium storing a program causing a computer to execute a three-dimensional shape data generating process, the process comprising:
acquiring element data generated by dividing a three-dimensional shape into first elements, the three-dimensional shape being modeled with a plurality of modeling materials having different resolutions, each first element corresponding to a resolution of a first modeling material among the plurality of modeling materials;
dividing the three-dimensional shape into second elements, each second element corresponding to a second modeling material having a resolution lower than the resolution of the first modeling material and having a size larger than the first element; and
generating three-dimensional shape data through setting modeling materials for the first and second elements, respectively, according to the number of the first elements covered by the second element by setting the second modeling material as the modeling material for the second element when, among a plurality of the first elements covered by the second element, the number of the first elements that is set to use the second modeling material is greater than or equal to than a predefined threshold.

* * * * *